United States Patent [19]
Veerasamy et al.

[11] Patent Number: 5,858,477
[45] Date of Patent: Jan. 12, 1999

[54] METHOD FOR PRODUCING RECORDING MEDIA HAVING PROTECTIVE OVERCOATS OF HIGHLY TETRAHEDRAL AMORPHOUS CARBON

[75] Inventors: Vijayen Veerasamy, Farmington Hills, Minn.; Manfred Weiler, Elbersdorf, Germany; Eric Li, Palo Alto, Calif.

[73] Assignee: Akashic Memories Corporation, San Jose, Calif.

[21] Appl. No.: 761,336

[22] Filed: Dec. 10, 1996

Related U.S. Application Data

[60] Provisional application Nos. 60/018,793 May 31, 1996 and 60/018,746 May 31, 1996.

[51] Int. Cl.$^6$ .................................................. B05D 3/14
[52] U.S. Cl. ...................... 427/562; 427/131; 427/249; 427/404; 427/419.2; 427/458; 427/523; 427/547; 427/577; 427/580; 427/591; 427/598
[58] Field of Search .................................... 427/458, 523, 427/577, 131, 249, 404, 419.2, 591, 547, 598, 580, 562

[56] References Cited

U.S. PATENT DOCUMENTS

| | | | |
|---|---|---|---|
| 4,123,316 | 10/1978 | Tsuchimoto | 156/643 |
| 4,226,666 | 10/1980 | Winters et al. | 156/643 |
| 4,822,466 | 4/1989 | Rabalais et al. | 204/192.15 |
| 5,017,835 | 5/1991 | Oechsner | 315/111.81 |
| 5,091,049 | 2/1992 | Campbell et al. | 156/643 |
| 5,156,703 | 10/1992 | Oechsner | 156/643 |
| 5,182,132 | 1/1993 | Murai et al. | 427/577 |
| 5,374,318 | 12/1994 | Rabalais et al. | 148/33 |
| 5,423,915 | 6/1995 | Murata et al. | 118/723 |
| 5,462,784 | 10/1995 | Grill et al. | 428/65.5 |
| 5,466,431 | 11/1995 | Dorfman et al. | 423/446 |

FOREIGN PATENT DOCUMENTS

| | | | |
|---|---|---|---|
| 552 491 A1 | 7/1993 | European Pat. Off. | H01J 37/32 |
| 0 595 564 A2 | 5/1994 | European Pat. Off. | G11B 5/72 |
| 0 700 033 A2 | 3/1996 | European Pat. Off. | G11B 5/31 |
| 2168540 | 6/1990 | Japan | H01J 27/18 |
| 5-143971 | 6/1993 | Japan | G11B 5/72 |
| 6-139560 | 5/1994 | Japan | G11B 5/72 |
| 6349054 | 12/1994 | Japan | G11B 5/72 |

OTHER PUBLICATIONS

Boxman, R.L. et al. "Recent Progress in Filtered Vacuum Arc Deposition," *Paper submitted, Int. Conf. Metallurgical Coatings and thin Films, San Diego, Apr. 1996*.

Veerasamy, V.S. et al. "Electronic Density of States in Highly Tetrahedral Hydrogenated Amorphous Carbon," *Solid–State Electronics*, vol. 37, No. 2, pp. 319–326, 1994, (No month avail.).

(List continued on next page.)

*Primary Examiner*—Bernard Pianalto
*Attorney, Agent, or Firm*—Townsend and Townsend and Crew LLP

[57] ABSTRACT

The invention provides systems and methods for the deposition of an improved diamond-like carbon material, particularly for the production of magnetic recording media. The diamond-like carbon material of the present invention is highly tetrahedral, that is, it features a large number of the $sp^3$ carbon—carbon bonds which are found within a diamond crystal lattice. The material is also amorphous, providing a combination of short-range order with long-range disorder, and can be deposited as films which are ultrasmooth and continuous at thicknesses substantially lower than known amorphous carbon coating materials. The carbon protective coatings of the present invention will often be hydrogenated. In a preferred method for depositing of these materials, capacitive coupling forms a highly uniform, selectively energized stream of ions from a dense, inductively ionized plasma. Such inductive ionization is enhanced by a relatively slow moving (or "quasi-static") magnetic field, which promotes resonant ionization and ion beam homogenization.

23 Claims, 12 Drawing Sheets

OTHER PUBLICATIONS

Weiler, M. et al. "Preparation and Properties of Highly Tetrahedral Hydrogenated Amorphous Caron," *Physical Review B,* vol. 53, No. 3, pp. 159–1608, 1996, (No month avail.).

Weiler, M. et al. "Structure of Amorphous Hydrogenated Carbon: Experiment and Computer Simulation," *Diamond and Related Materials,* vol. 3, pp. 245–253, 1994, (No month avail.).

Chhowalla, M. et al. "Deposition of Smooth Tetrahedral Amorphous Carbon Thin Films Using a Cathodic Arc Without a Macroparticle Filter," *Appl. Phys. Lett.,* vol. 67, No. 7, pp. 894–896, 1995, (No month avail.).

Chhowalla, M. et al. "Statoinary Carbon Cathodic Arc: Plasma and Film Characterization," *J. Appl. Phys.,* vol. 79, No. 5, pp. 2237–2244, 1996, (No month avail.).

Oechsner, H. "Electron Cyclotron Wave Resonance and Power Absorption Effects in Electrodeless Low Pressure H.F. Plasmas with a Superimposed Static Magnetic Field," *Plasma Physics,* vol. 16, pp. 835–844, 1974, (No month avail.).

Oechsner, H. et al. "An RF Plasma Beam Source for Thin Film and Surface Technology," *Proc. 1st Int. Conf. on Plasma Surface Engineering,* Garmisch Partenkirchen, 1988, vol. II, DGM Informationen Gesellschaft, Obvuroel, pp. 1017–1024, 1989, (No month avail.).

Pfeiffer, B. "Skin Effect in Anisotropic Plasmas and Resonance Excitation of Electron–Cyclotron Waves. I. Theory," *Journal of Applied Physics,* vol. 37, No. 4, pp. 1624–1627, 1966, (No month avail.).

Sager, O. "the Influence of Nonuniform Density Distribution and Electron Temperature on the Helicon–Resonances in Low Pressure Discharges," 1971, (No month avail.).

Szuszczewicz, Edward P., "Spatial Distributions of Plasma Density in a High–Frequency Discharge with a Superimposed Static Magnetic Field," *the Physics of Fluids,* vol. 15, No. 12, pp. 2240–2246, 1972, (No month avail.).

Weiler, M. et al. "Highly Tetrahedral, Diamond–like Amorphous Hydrogenated Carbon Prepared from a Plasma Beam Source," *Appl. Phys. Lett.,* vol. 64, No. 23, pp. 2797–2799, 1994, (No month avail.).

Thesis by Manfred Weiler, 1989, (No month avail.).

Dissertation by Manfred Weiler, 1994, (No month avail.).

Dissertation by Dieter Martin, 1995, (No month avail.).

Thesis by Franz Schön, 1968, (No month avail.).

Thesis by Armin Fuchs, 1987, (No month avail.).

Dissertation by Vijayen S. Veerasamy, 1994, (No month avail.).

Kühn M., et al. "Deposition of Carbon Films By A Filtered Cathodic Arc", *Diamond and Related Materials,* vol. 2, No. 10, Aug. 1993, pp. 1350–1354.

METHOD FOR PRODUCING RECORDING MEDIA HAVING PROTECTIVE OVERCOATS OF HIGHLY TETRAHEDRAL AMORPHOUS CARBON

CROSS-REFERENCE TO RELATED APPLICATIONS

This application is a continuation-in-part of and claims priority from U.S. Provisional Patent Application Ser. No. 60/018,793, filed May 31, 1996, and Ser. No. 60/018,746, filed May 31, 1996, the full disclosures of which are incorporated herein by reference.

BACKGROUND OF THE INVENTION

1. Field of the Invention

The present invention relates generally to thin films and methods for their deposition, and more particularly, provides diamond-like films, plasma beam deposition systems, and methods useful for production of diamond-like protective overcoats on magnetic recording media and other industrial applications.

In recent years, there has been considerable interest in the deposition of a group of materials referred to as diamond-like carbon. Diamond-like carbon can generally be defined as a metastable, high density form of amorphous carbon. Diamond-like carbon is valued for its high mechanical hardness, low friction, optical transparency, and chemical inertness.

Deposition of diamond-like carbon films often involves chemical vapor deposition techniques, the deposition processes often being plasma enhanced. Known diamond-like films often include carbon with hydrogen, fluorine, or some other agent. The durability and advantageous electrical properties of diamond-like carbon films have led to numerous proposals to apply these films to semiconductors, optics, and a wide variety of other industrial uses. Unfortunately, the cost and complexity of providing these advantageous diamond-like carbon films using known chemical vapor deposition processes has somewhat limited their use. Furthermore, while a wide variety of diamond-like carbon coating films have been deposited in laboratories, many of these films have been found to have less than ideal material characteristics.

A very different form of amorphous carbon is generally applied as a protective overcoat for magnetic recording media. Magnetic recording disks generally comprise a substrate having a magnetic layer and a number of underlayers and overlayers deposited thereon. The nature and composition of each layer is selected to provide the desired magnetic recording characteristics, as is generally recognized in the industry.

The information stored in magnetic recording media generally comprises variations in the magnetic field of a thin film of ferromagnetic material, such as a magnetic oxide or magnetic alloy. Usually, a protective layer is formed over the top of the magnetic layer, and a layer of lubricating material is deposited over the protective layer. These protective and lubricating layers combine to increase the reliability and durability of the magnetic recording media by limiting friction and erosion of the magnetic recording layer. Sputtered amorphous carbon films have gained widespread usage as protective overcoats for rigid magnetic recording disks.

Sputtered amorphous carbon overcoats have been shown to provide a high degree of wear protection with a relatively thin protective layer. Magnetic recording disk structures including sputtered amorphous carbon have been very successful and allow for quite high recording densities. As with all successes, however, it is presently desired to provide magnetic recording disks having even higher recording densities.

Recording densities can generally be improved by reducing the spacing between the recording transducer, called the read/write head, and the magnetic layer of the magnetic recording disk (or more specifically, between the read/write head and the middle of the magnetic layer). In modern magnetic recording systems, the read/write head often glides over the recording surface on an air bearing, a layer of air which moves with the rotating disk. To minimize frictional contact between the rotating disk and the read/write head, the disks surface is generally rougher (and the glide height therefore higher) than would otherwise be ideal for high density magnetic recording. Even if this glide height is reduced (or eliminated), the read/write head will be separated from the recording layer by the protective amorphous carbon overcoat. This protective layer alone may, to provide the desired media life, limit the areal density of the media. Generally, overcoat layer thicknesses are dictated by durability and continuity limitations. Sputtered carbon frequently becomes discontinuous at thicknesses below about 50 Å. Thus, the durability requirements of rigid magnetic recording media generally dictate that the distance between the read/write head and the magnetic recording layer be maintained, even though this limits the areal density of the magnetic recording media.

It has previously been proposed to utilize known chemical vapor deposition techniques to deposit a variety of diamond-like carbon materials for use as protective coatings for flexible magnetic recording tapes and magnetic recording heads. Unfortunately, known methods for chemical vapor deposition of diamond-like materials, including plasma enhanced methods, generally subject the substrate to temperatures of over 500° C., which is deleterious for most magnetic disk substrates. Therefore, these known diamond-like carbon films do provide relatively good hardness and frictional properties, they have found little practical application within the field of rigid magnetic recording media, in which sputtered amorphous carbon protective overcoats are overwhelmingly dominant.

For these reasons, it would be beneficial to provide improved magnetic protective overcoats with improved read/write head frictional and glide characteristics (generally called stiction) for recording media. Preferably, such an improved overcoat will provide durability and reliability without having to resort to the density-limiting glide heights and/or protective overcoat thickness of known rigid magnetic recording media, and without subjecting the media substrates to excessive temperatures.

It would also be desirable to provide improved diamond-like carbon materials and methods for their deposition. It would be particularly desirable if such materials and methods could be utilized for practical rigid magnetic recording media with reduced spacing between the read/write head and the magnetic recording layer, ideally by providing a flatter, smoother, and thinner protective coating which maintained or even enhanced the durability of the total recording media structure. It would also be advantageous to provide alternative methods and systems for depositing such protective layers, for use in the production of magnetic recording media, as well as integrated circuits, optics, machine tools, and a wide variety of additional industrial applications.

2. Description of the Background Art

U.S. Pat. No. 5,182,132 describes magnetic recording media having a diamond-like carbon film deposited with alternating circuit plasma enhanced chemical vapor deposition methods. U.S. Pat. No. 5,462,784 describes a fluorinated diamond-like carbon protective coating for magnetic recording media devices. European Patent Application 700, 033 describes a side-mounted thin film magnetic head having a protective layer of diamond-like carbon. European Patent Application No. 595,564 describes a magnetic recording media having a diamond-like protective film which consists of carbon and hydrogen.

U.S. Pat. No. 5,156,703 describes a method for the surface treatment of semiconductors by particle bombardment, the method making use of a capacitively coupled extraction grid to produce an electrically neutral stream of plasma. V. S. Veerasamy et al. described the properties of tetrahedral amorphous carbon deposited with a filtered cathodic vacuum arc in *Solid-State Electronics,* vol. 37, pp. 319–326 (1994). The recent progress in filtered vacuum arc deposition was reviewed by R. L. Boxman in a paper presented at the International Conference of Metallurgical Coatings and Thin Films located at San Diego in April of 1996. Electron cyclotron wave resonances in low pressure plasmas with a superimposed static magnetic field were described by Professor Oechsner in *Plasma Physics,* vol. 15, pp. 835–844 (1974).

SUMMARY OF THE INVENTION

The present invention provides systems and methods for the deposition of an improved diamond-like carbon material, particularly for the production of magnetic recording media. The diamond-like carbon material of the present invention is highly tetrahedral, that is, it features a large number of the $sp^3$ carbon—carbon bonds which are found within a diamond crystal lattice. The material is also amorphous, providing a combination of short-range order with long-range disorder, and can be deposited as films which are ultrasmooth and continuous (pin-hole free) at thicknesses substantially lower than known amorphous carbon coating materials. The carbon protective coatings of the present invention will often be hydrogenated, generally providing a significantly higher percentage of carbon-carbon $sp^3$ bonds than known hydrogenated amorphous diamond-like carbon coatings having similar compositions, and may optionally be nitrogenated. In a preferred method for depositing of these materials, capacitive coupling forms a highly uniform, selectively energized stream of ions from a dense, inductively ionized plasma. Such inductive ionization is enhanced by a relatively slow moving (or "quasi-static") magnetic field, which promotes resonant ionization and ion beam homogenization. Clearly, the materials, systems, and methods of the present invention will find applications not only in the field of magnetic recording media and related devices, but also in integrated circuit fabrication, optics, machine tool coatings, and a wide variety of film deposition and etching applications.

In a first aspect, the present invention provides a method for producing magnetic recording media, the method comprising forming a magnetic layer over a substrate, and ionizing a source material so as to form a plasma containing carbon ions. The carbon ions are energized to form a stream from the plasma toward the substrate, so that carbon from the ions is deposited on the substrate. The ions impact with an energy which promotes formation of $sp^3$ carbon—carbon bonds. Advantageously, such a method can form a highly tetrahedral amorphous carbon protective layer, generally having more than about 15% $sp^3$ carbon—carbon bonds. Generally, the impact energy of the energetic carbon ions is within a pre-determined range to promote formation of the desired lattice structure, the bonds apparently being formed at least in part by subplantation. Preferably, each carbon ion impacts with an energy of between about 100 and 120 eV. In many embodiments, the resulting highly tetrahedral amorphous carbon protective layer includes more than about 35% $sp^3$ carbon—carbon bonds, with particularly preferred methods producing more than about 70% $sp^3$ carbon—carbon bonds.

Generally, the stream will be primarily composed of ions having a uniform weight, and the impact energy will preferably be substantially uniform. In some embodiments, this uniformity is promoted through filtering of the ion stream. In such cases, the energizing step generally comprises striking a plasma using a solid cathodic arc of carbon source material. Alternatively, the stream will be energized by applying an alternating potential between a coupling electrode and an extraction grid so as to self-bias the plasma relative to the extraction grid through capacitive coupling, thereby extracting the ion stream through the grid. Hydrogen and/or nitrogen may also be included, both in the ion stream and the protective layer.

In another aspect, the present invention provides magnetic recording media comprising a substrate, a magnetic layer disposed over the substrate, and a protective layer disposed over the magnetic layer. The protective layer comprises a highly tetrahedral amorphous carbon, generally having more than about 15% $sp^3$ carbon—carbon bonds. Preferably, these bonds are formed at least in part by directing an energetic stream of carbon ions onto the substrate. In many embodiments, the protective layer includes more than about 35% $sp^3$ carbon—carbon bonds, with particularly preferred embodiments including more than about 70% $sp^3$ carbon—carbon bonds. Such protective layers are ultrasmooth and continuous at thicknesses of less than about 75 Å, and will provide durable recording media even at thicknesses of less than about 50 Å. Furthermore, the hardness and tribological performance of these dense protective materials may allow highly durable recording media with areal recording densities of over 1 gigabyte per square inch with reduced read/ write head glide heights of lower than about 1 $\mu$", optionally within a near-contact or continuous contact recording systems.

In another aspect, the present invention provides a method for enhancing an ion beam, the ion beam produced by confining a plasma within a plasma volume, inductively ionizing the plasma, and forming a stream of ions from within the plasma volume by capacitive coupling. The method comprises moving a magnetic field through the plasma to promote resonant inductive ionization, preferably by sequentially energizing each of a plurality of coils disposed radially about the plasma volume.

In another aspect, the present invention provides an inductive ionization system for use with an ion-beam source. The source includes an antenna disposed about a plasma volume for inductively ionizing a plasma therein. A coupling electrode is exposed to the plasma volume and an extraction electrode is disposed over an opening of the plasma volume, so that the extraction electrode is capable of expelling ions of the plasma through the grid by capacitive coupling. The system comprises at least one coil disposed adjacent the plasma volume capable of applying a transverse magnetic field to the plasma volume so as to promote resonant inductive ionization by the antenna. The magnetic field can be moved through the plasma container to homogenize the expelled ion stream. This movement of the magnetic field, which is optionally provided by selectively energizing coils radially disposed about the plasma volume, may also further densify the plasma by promoting particle collisions through a churning or mixing effect.

In another aspect, the present invention provides a diamond-like material comprising carbon in the range between about 72 and 92 atomic percent, and hydrogen in the range between about 8 and 18 atomic percent. The material is amorphous, and between about 15 and 85 percent of carbon—carbon bonds are $sp^3$ bonds. Generally, $sp^3$ bond formation will be promoted with subplantation using ion-beam deposition from a plasma beam source, so that the number of such bonds will be higher than known materials having similar compositions. Hence, the highly tetrahedral amorphous carbon and hydrogenated carbon of the present invention will have fewer polymer-like hydrogen chains, and will generally exhibit enhanced thermal and mechanical stability.

In another aspect, the present invention provides a method for deposition of highly tetrahedral amorphous carbon over a substrate, the method comprising ionizing a source material to form a plasma and confining the plasma within a plasma volume. The plasma is capacitively coupled to form a stream flowing outwardly from within the plasma volume. The stream includes carbon ions from the plasma and is directed onto the substrate. Advantageously, such a method allows deposition of carbon ions of uniform size with a uniform energy, and allows tailoring of the energetic carbon ions to specifically promote $sp^3$ bonding through subplantation. The source material typically comprises a gas having a substantially coherent dissociation energy spectra, the source gas ideally comprising acetylene. Preferably, the ions strike the substrate with an impact energy of between about 57 and 130 eV for each carbon atom, ideally being between about 80 and 120 eV each.

In another aspect, the present invention provides an ion-beam source comprising a container defining a plasma confinement volume. The container has an opening, and an antenna is disposed about the plasma volume so that application of a first alternating potential to the antenna is capable of inductively ionizing a plasma therein. A coupling electrode is electrically coupled to the plasma volume and an extraction electrode is disposed over the opening of the container. The extraction electrode has a surface area which is substantially less than the coupling electrode surface, so that application of a second alternating potential between the coupling electrode and the extraction electrode is capable of expelling ions of the plasma through the grid. Preferably, at least one coil is disposed adjacent the container, and is capable of applying a transverse magnetic field to the plasma volume, thereby promoting highly efficient inductive ionization resonance by the antenna. Ideally, the magnetic field can be moved through the plasma container to homogenize the expelled ion stream. This movement of the magnetic field, which is optionally provided by selectively energizing coils radially disposed about the plasma confinement volume, may further density the plasma by promoting particle collisions with a churning or mixing effect.

In yet another aspect, the present invention provides an ion-beam source comprising plasma containment means for confining a plasma within a plasma volume. Inductive ionization means inductively couples a first alternating current with the plasma so as to ionize the plasma within the plasma volume. A moving magnetic field generation means provides resonant densification and homogenization of the ionized plasma within the plasma volume. Ion extraction means forms a stream of ions out from the plasma volume.

In another aspect, the present invention provides a method for producing an ion beam, the method comprising confining a plasma within a plasma volume, inductively ionizing the plasma, and forming a stream of ions from within the plasma volume by capacitively coupling the plasma with an extraction grid. This capacitive coupling self-biases the plasma relative to the grid, and can be used to produce a quasi-neutral plasma stream. Generally, a transverse magnetic field is applied to density the plasma by promoting resonant inductive ionization. Ideally, the magnetic field is moved through the plasma volume to homogenize the plasma and plasma stream.

DESCRIPTION OF THE SPECIFIC EMBODIMENTS

Figure 1:
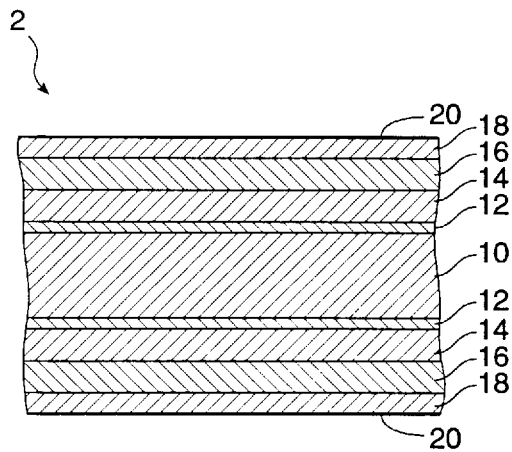
FIG. 1 is a cross-sectional view of a magnetic recording disk including the tetrahedral amorphous hydrogenated carbon protective layer of the present invention.

Referring now to FIG. 1, a rigid magnetic recording disk 2 comprises a non-magnetic disk substrate 10, typically composed of an aluminum alloy, glass, ceramic, a glass-ceramic composite, carbon, carbon-ceramic composite, or the like. An amorphous nickel-phosphorus (Ni—P) layer 12 is formed over each surface of the disk substrate 10, typically by plating. The Ni—P layer is hard, and imparts rigidity to the aluminum alloy substrate. A chromium ground layer 14 is formed over Ni—P layer 12, typically by sputtering, and a magnetic layer 16 is formed over the ground layer 14. Please note that these layers are shown schematically only, as NiP layer 12 will typically be much thicker than the other layers.

The magnetic layer 16 comprises a thin film of a ferromagnetic material, such as a magnetic oxide or magnetic alloy. Magnetic layer 16 is typically sputtered over ground layer 14 in a conventional manner. The magnetic layer will often be composed of a cobalt alloy, such as a CoCrTaPtB, CoCrPtB, CoCrTa, CoPtCr, CoNiCr, CoCrTaXY (X and Y being selected from Pt, Ni, W, B, or other elements) or the like. The magnetic layer may be formed as a single layer, or may comprise two or more layers formed over one another. The thickness of magnetic layer 16 is typically in the range from about 200 Å to 800 Å.

Of particular importance to the present invention is a protective layer 18 which is formed over the magnetic layer. The protective layer 18 of the present invention will generally comprise a highly tetrahedral amorphous carbon, typically having more than about 15% $sp^3$ carbon—carbon bonds, preferably being more than about 35% $sp^3$ carbon—carbon bonds, and ideally being over about 70% $sp^3$ carbon—carbon bonds, as measured using Raman fingerprinting and electron energy loss spectroscopy. Along with carbon, protective layer 18 may also include hydrogen, generally forming in the range between about 2 and 30 atomic percent of the protective material, preferably being between 8 and 18 atomic percent. A conventional lubricating layer 20 is disposed over the protective layer.

Although hydrogen is known to increase the percentage of $sp^3$ bonding of diamond-like carbon produced by known chemical vapor deposition processes, protective layer 18 will generally include significantly less hydrogen than comparable known diamond-like films. This compositional difference may be explained in part by the formation of $sp^3$ bonds through subplantation of the energetic carbon ions during deposition. Effectively, the energetic ions deposited using the methods described hereinbelow impact on the growing film surface, and are driven into the film so as to cause densification. This process may also explain why the protective layer of the present invention includes a higher percentage of quarternary carbon sites ($sp^3$ carbon sites with no hydrogen neighbors) and greater hardness than known alternative amorphous carbon materials.

The microstructure of conventional hydrogenated amorphous carbons includes polymer-like hydrocarbon chains. Although hydrogen enhances the formation of tetrahedrally bonded carbon atoms, above a certain threshold value of hydrogen content, carbon films become polymeric and hence lose their protective properties. Through subplantation, the materials of the present invention overcome this limitation. As subplantation promotes formation of $sp^3$ bonds without relying on additional hydrogen content alone, polymerization can be avoided. This represents a substantial advantage over known, more highly hydrogenated diamond-like carbon materials, in which polymerization significantly limits both thermal and mechanical stability. In contrast, the carbon-carbon $sp^3$ bonds of the materials of the present invention will generally be stable up to temperatures of about 700° C., so that an enhanced percentage of $sp^3$ bonds with a low hydrogen content represents a significant advantage.

Figure 1A:
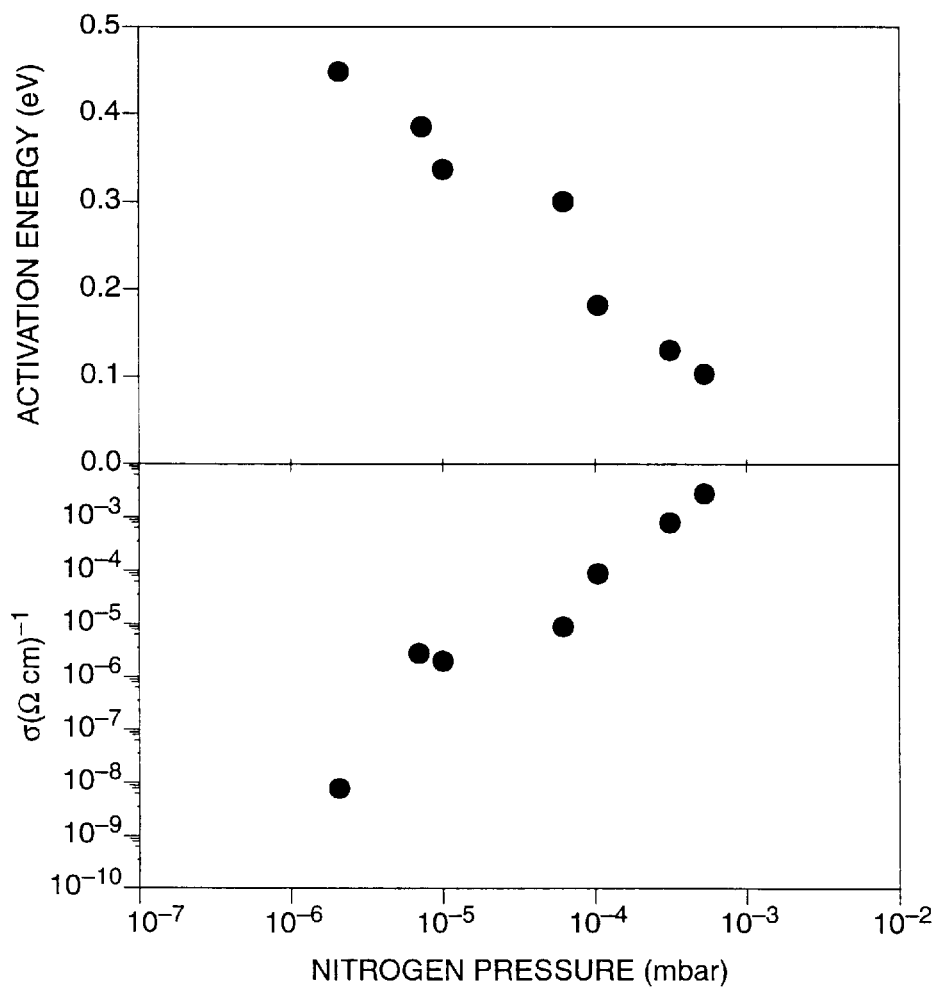
FIGS. 1A and B illustrate the effects of nitrogen doping on the tetrahedral amorphous hydrogenated carbon of the present invention.
Figure 1B:
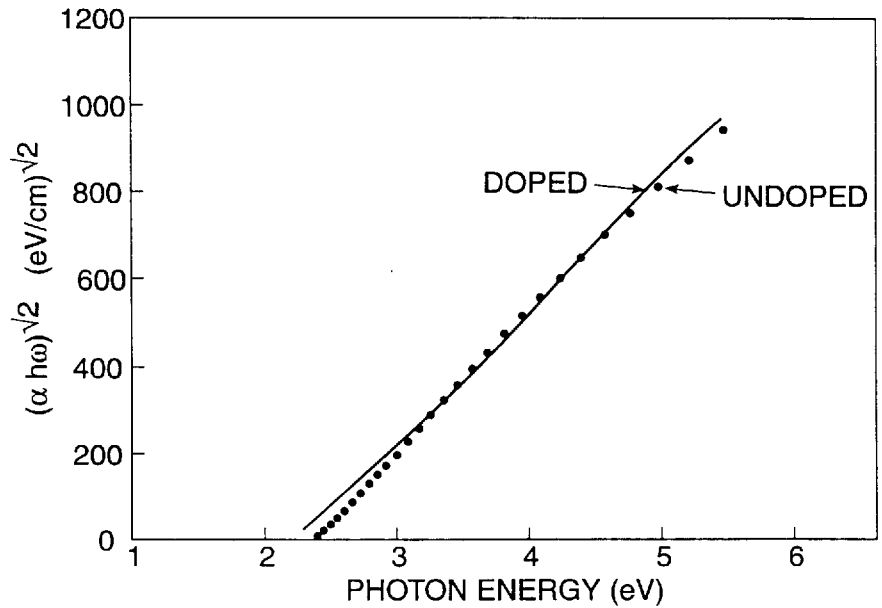

Optionally, the films of the present invention may also be nitrogenated. In contrast to known hydrogenated carbon, the electrical conductivity of the present highly tetrahedral amorphous carbon can be controllably varied over a wide range by the selective incorporation of nitrogen during the $C_2H_2$ plasma beam deposition process described hereinbelow. Advantageously, this variation will be provided without significantly varying the structural properties of the film. With conventional hydrogenated carbon, nitrogen incorporation may be related to the formation of $sp^2$ bonds. This will be evident by variations in the mechanical and optical properties of the films deposited, for which harness and optical gap will decrease with nitrogen content. With the present film materials and deposition methods, a classic doping effect is observed, in which electrical conductivity can be controllably varied by as much as 5 orders of magnitude or more, as is shown in FIGS. 1A and B. Doping can be provided by varying nitrogen pressure within a plasma volume of an acetylene fed plasma beam source, typically to provide films having from about 4 to about 30 atomic percent nitrogen. This doping effect of highly tetrahedral amorphous carbon and hydrogenated carbon will find particular application for the fabrication of integrated circuits and the like.

The highly tetrahedral amorphous carbon materials of the present invention also provide a number of advantages over known protective layers for recording media. The bond structure of this material provides physical properties approaching those of diamond, including a hardness of over about 50 GPa, with certain species having hardness of up to about 80 GPa. Furthermore, the present protective overcoats have high density, generally being over about 2.5 grams per cubic centimeter, and are also very chemically inert.

Of particular importance to recording media, these coatings are smooth and continuous (pinhole-free) at very low thicknesses, and provide a durable protective layer when deposited to a thickness of less than 75 Å, preferably being less than 50 Å thick. In fact, films of over 150 Å may be more susceptible to delamination, and surface roughness may increase with thickness. The high mechanical hardness and low friction surfaces provided by these materials lead to enhanced tribological performance, providing recording media which are highly tolerant to the mechanical abrasion and contact start-stop demands of modern recording media systems, and allowing increased areal density through reduced separation between the read/write and the magnetic layer. This separation may be reduced by either a reduction in the protective layer thickness, or by a reduction in head glide height, and preferably by a reduction in both. Protective layer 18 is generally in the range between about 30 Å and 70 Å, which will allow the disk to meet recording media industry durability and stiction test requirements.

The composition and characterization of the protective film of the present invention are highly dependent on the deposition method, and in particular, depend strongly on the energy and uniformity of carbon ions striking the deposition surface.

Figure 2:
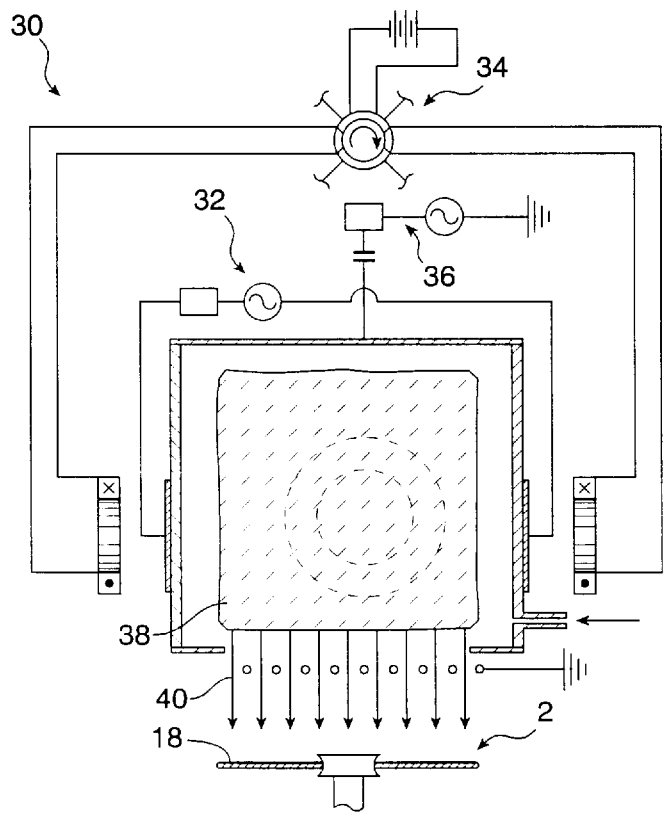
FIGS. 2 schematically illustrates a method for depositing the highly tetrahedral amorphous hydrogenated carbon over the disk of FIG. 1, and also shows a hybrid inductive/capacitive plasma beam source according to the principles of the present invention.
Figure 2A:
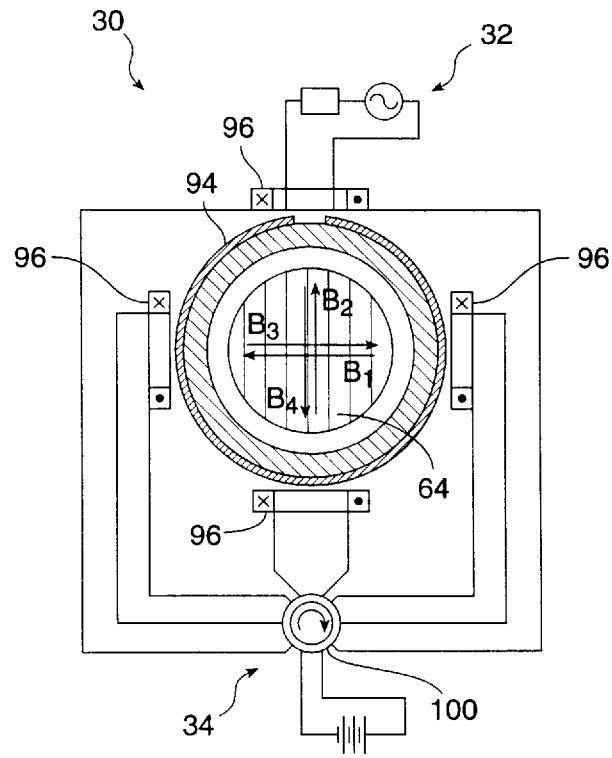
FIG. 2A is a cross-sectional view of the hybrid source of FIG. 2, showing the inductive ionization antenna and quasi-static magnetic field generating coils which density and homogenize the plasma.

An exemplary system and method for depositing protective layer 18 on rigid recording disk 2 will be described with reference to FIGS. 2 and 2A. Hybrid ion beam source 30 generally includes an inductive ionization system 32, a quasi-static magnetic field system 34, and a capacitive ion beam extraction system 36.

In general terms, induction system 32 ionizes a plasma 38. The energy transfer between induction system 32 and plasma 38 is greatly enhanced and homogenized by a transverse magnetic field generated by quasi-static field system 34. The deposition ions of plasma 38 are actually directed to recording disk 2 (or to any other substrate on which deposition is desired, or from which etching will be performed) using capacitive coupling system 36.

Although hybrid source 30 provides a particularly advantageous system for deposition of the protective coating 18, a variety of alternative deposition systems may also be used. As a plasma beam source deposition system shares a number of the features of hybrid source 30, but is simpler in operation, diamond-like carbon deposition using a plasma beam source 50 will be described with reference to FIGS. 3A–F, after which other aspects of hybrid source 30 will be explained in more detail.

Figure 3A:
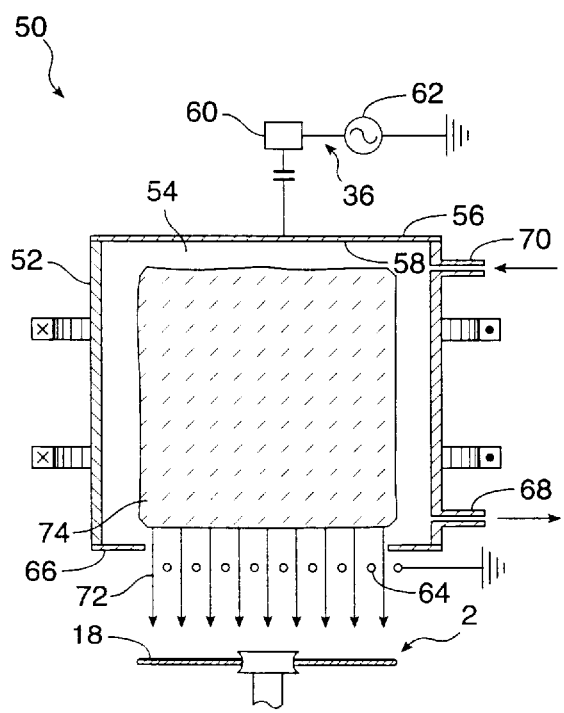
FIG. 3A illustrates an alternative method and system for depositing highly tetrahedral amorphous hydrogenated carbon over the disk of FIG. 1 using an acetylene plasma from a plasma beam source.

Referring now to FIG. 3A, the use of plasma beam source 50 for the deposition of carbon will generally be described with reference to depositing protective layer 18 on magnetic recording media 2. As has been mentioned above, these carbon deposition systems and methods will have a wide variety of alternative uses, particularly in the areas of integrated circuits fabrication, optics, and machine tools.

Plasma beam source 50 includes a plasma container 52 which defines a plasma volume 54 therein. Container 52 is typically an 8 cm diameter glass tube, or may alternatively comprise quartz or the like. A coupling electrode 56 having a relatively large surface 58 here forms one end of the container. Alternatively, the coupling electrode may be disposed within or external to the container, and may optionally extend axially along the walls of the container. Regardless, coupling electrode 56 is generally electrically coupled to the plasma, to a matching network 60, and to a radiofrequency coupling power supply 62. Plasma coupling system 36 includes coupling electrode 56, the frequency generator and matching network 60, 62, and an extraction grid 64. Typically, the extraction grid will be grounded as shown.

As is explained more fully in U.S. patent Ser. No. 5,156,703, the full disclosure of which is herein incorporated by reference, extraction grid 64 has a much smaller surface area exposed to the plasma than the coupling electrode 56. In operation, RF power, typically at about 13.56 MHz, is supplied by the frequency generator through the matching network and a capacitor to the coupling electrode. This frequency will often be set by government regulations, and may alternatively be about 27.12 MHz, or some other multiple thereof. The extraction grid typically comprises a graphite rim 66 defining an aperture, and tungsten filaments which are maintained under tension. Hence, extraction grid 64 resists any distortion due to thermal expansion. A number of alternative materials may be used in the filaments, the filament materials preferably having a low sputtering yield.

Generally, internal pressure within plasma volume 54 is reduced by removing gas through vacuum port 68. While the vacuum port is here shown behind the grid, it will preferably be disposed between grid 64 and disk 2. Advantageously, when a plasma is struck between the coupling electrode and the extraction grid, the plasma shifts to a positive DC potential with respect to the extraction grid, due to the relative mobility of the electrons as compared to the ions within the plasma. Specifically, the greater mobility of electrons than ions in the plasma causes the plasma to form a sheath between itself and each electrode. The sheaths act as diodes, so that the plasma acquires a positive DC bias with respect to each electrode.

The total radiofrequency potential $V_0$ will be divided between the sheaths adjacent the powered electrode and the grounded electrode, according to their respective capacitances. As the extraction electrode is grounded, the voltage of the plasma itself is given by the equation $$V = V_0(C_e/(C_g + C_e))$$

wherein $C_e$ is the capacitance of the coupling electrode, while $C_g$ is the capacitance of the extraction grid.

Where the extraction electrode is grounded, this plasma voltage biases the plasma relative to the grid, accelerating the ions through the extraction grid and toward the substrate. As can be determined from the above equation, the plasma beam source allows the biasing voltage to be selectively controlled, providing a highly advantageous mechanism for controlling ion impact energy.

As capacitance varies inversely with area, the size of the bias voltage at each electrode can be controlled by varying the electrode areas. As the extraction grid has a much smaller area than the coupling electrode, the biasing of the plasma relative to the coupling electrode is relatively low, so that source 50 provides a fairly efficient use of the source gas material, which is generally provided through source inlet 70 adjacent coupling electrode 56. While some material will be deposited on the container walls at higher power settings, use of the plasma beam source in an etching mode may allow self cleaning.

Figure 3B:
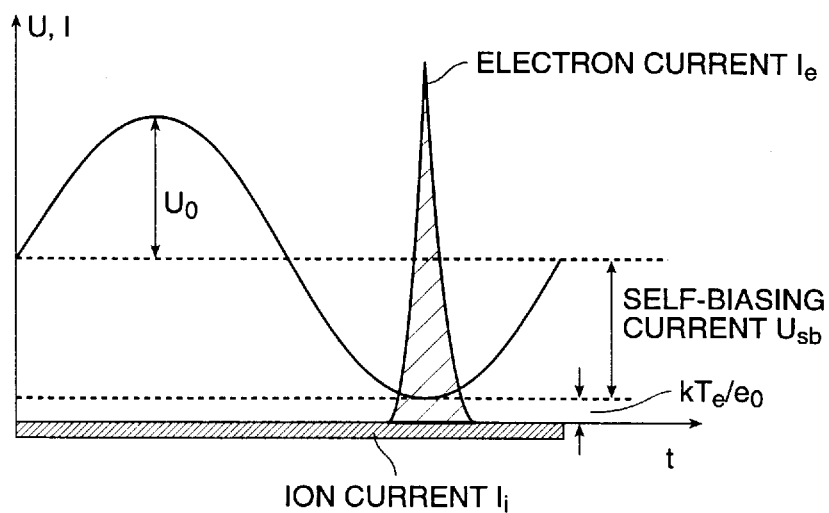
FIGS. 3B and C illustrate capacitive coupling of the plasma to extract a stream of ions when using the plasma beam source of FIG. 3A.
Figure 3C:
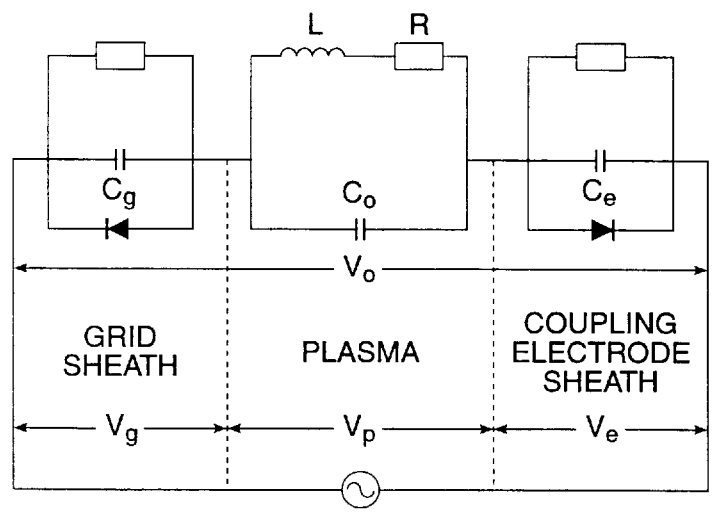
FIG. 3D illustrates an alternative embodiment of a plasma beam source, in which the effective area of the coupling electrode can be varied to provide further control over the ion density and ion energy.
FIGS. 3E and F illustrate operating characteristics of plasma beam sources for deposition of diamond-like carbon.

The relationship of electron current, ion current, and the radiofrequency potential is illustrated in FIG. 3B. A simplified electrical diagram for analysis of the plasma, the extraction grid sheath, and the coupling grid sheath, is shown in FIG. 3C.

Figure 3D:
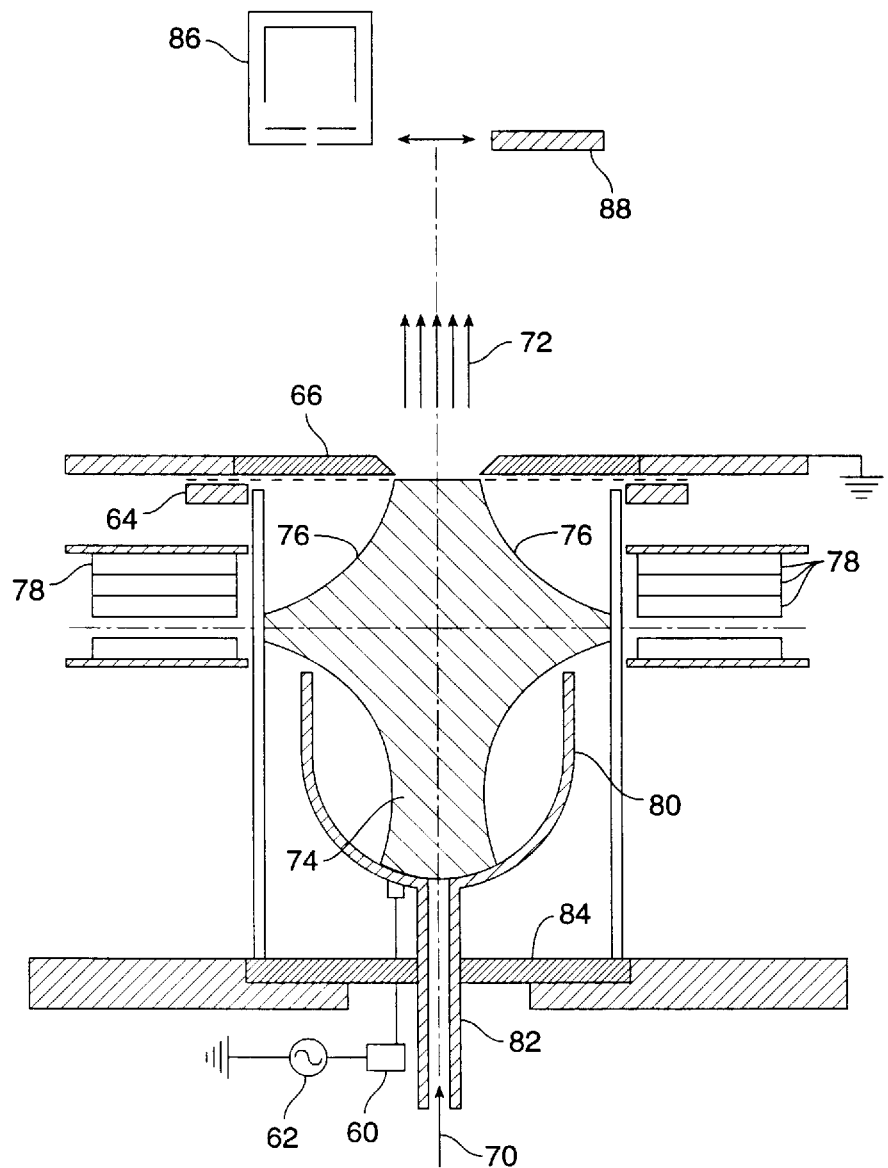

A still further aspect of the plasma beam source carbon deposition system and method of the present invention is illustrated in FIG. 3D. Plasma 74 is here contained within a hyperbolic magnetic field produced by magnets 78. An axially movable coupling electrode 80 is supported by a movable ceramic pipe 82 which slides axially through a ceramic end 84 of the plasma container vessel.

Figure 3E:
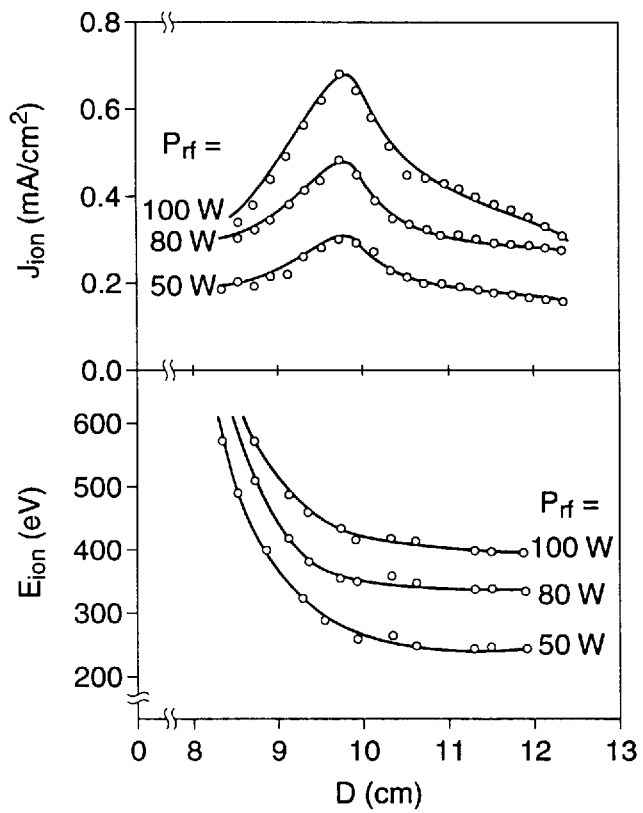

The magnetic confinement of the plasma allows the effective area of coupling electrode 80 to be varied by moving the coupling electrode axially relative to the plasma. This allows the bias voltage (and hence the ion energy) to be varied without changing the radiofrequency power or the gas pressure. Alternatively, the ion saturation current density (deposition rate) and ion energy can be varied by changing the radiofrequency power and gas feed stock flow rate. The ion current and ion energy distribution can be measured with a Faraday cup 86 in the substrate plane 88. FIG. 3E shows variations of ion current and mean ion energy with electrode position D for a range of radiofrequency powers.

The ion energy depends on at least two factors: the acceleration potential across the grid sheath, and the energy lost by collisions within the sheath. The effects of these factors are illustrated in FIG. 3F.

Figure 3F:
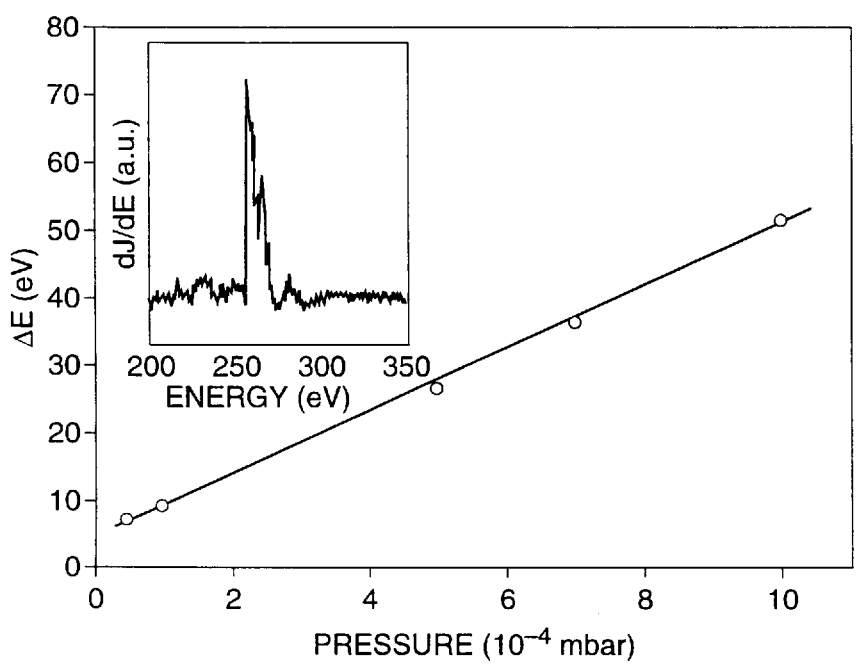

The inset to FIG. 3F shows that the ion energy distribution of the plasma beam is quite sharp, with a width of approximately 5% about the bias voltage. The sharpness apparently arises for at least two reasons. First, ions lose little energy in the low plasma pressure through collisions within the sheath. Second, the sheath width varies inversely with the square root of pressure, so that the sheath is quite wide at low pressures. Where the ion transit time across the sheath is longer than the radiofrequency period, the ions may be accelerated by the mean voltage rather than the instantaneous voltage. The ion energy distribution width is also found to vary linearly with pressure, which indicates that the ion energy distribution width is controlled mainly by ion collisions in and above the sheath.

The decomposition or dissociation of hydrocarbons in plasma 74 depends strongly on the source gas, the operation pressure, and the gas flow rate. Usually, hydrocarbon plasmas exhibit a wide spectrum of hydrocarbon radicals in an ionized and/or neutral state. The plasma composition depends on the various chemical pathways in the plasma, and these depend on the plasma parameters such as electron temperature, electron density, and degree of ionization. As a result, a number of different ions may be present in the plasma, and the composition may change markedly under different conditions, making uniform deposition of homogeneous hydrogenated carbon materials fairly problematic.

Work in connection with the present invention has shown that acetylene provides a highly advantageous source gas because of its relatively simple dissociation pattern. The plasma decomposition of a molecule can be described in terms of electron-molecule (primary) and ion-molecule (secondary) collisions, and their associated rate coefficients or their related appearance potentials. Advantageously, the dissociation of acetylene is dominated by its ionization at an appearance potential of 11.2 eV. Acetylene may be unique among the hydrocarbons in having such a well-defined reaction path.

The ionic composition of a plasma beam produced using an acetylene source gas produces a mass spectra at various plasma pressures which are dominated by the $C_2H_2^+$ ion and other hydrocarbon ions having two carbon atoms, collectively referred to as the $C_2$ species. The next most significant ions are the $C_4$ ions, which have been found to decrease in intensity as the pressure is lowered, being below 5% if the pressure is maintained below $5 \times 10^{-5}$ mbar. For these reasons, carbon deposition using the plasma beam source and hybrid source of the present invention is preferably performed using a feed stock which comprises acetylene. Optionally, $N_2$, $NF_3$, or some other nitrogen feedstock may also be included to provide nitrogenated films.

The particle flux or stream provided by a plasma beam deposition system or a hybrid deposition system will generally have a higher degree of ionization than conventional deposition techniques. The formation of carbon-carbon $sp^3$ bonds through the subplantation effect may only be significant if sufficient ions are present in the particle stream. Preferably, at least 15% of the particles will comprise ions. In some embodiments, particularly at very low deposition pressures, the film-forming particle flux will comprise over 90% ions.

When depositing using a plasma beam source, the incident power provided to the coupling electrode will generally be between about 50 and 700 watts, ideally being between about 200 and 300 watts. Where opposite sides of a substrate will be simultaneously coated, two plasma beam sources may be provided, preferably having independent radiofrequency generators which are phase-matched, ideally being synchronized in a master/slave configuration. Radiofrequency reflected power will generally be between about 5 and 70 watts, and should be minimized by selection of proper network elements.

The magnetic containment field coil nearest the substrate may be provided with a current of between 1 and 8 amps, ideally being about 7 amps. The outer field coil will have between one-half and 5 amps of current flowing therethrough, wherein the current is the reverse polarity of the inner coil current. Gas flow rates of from 5 sccm to 30 sccm are sufficient to maintain the plasma, with the gas flow rate ideally being about 18 sccm. Igniting the plasma is facilitated by providing an initial burst of between 40 and 50 sccm of $N_2$ gas. A nitrogen gas flow may be maintained for nitrogenation of the film.

The plasma beam source is capable of depositing ions with an energy of between about 10 eV and 500 eV, while the optimal energy for deposition of carbon is generally between about 80 and 120 eV per carbon atom. The hydrogen content may be between about 8 and 18 atomic percentage, while dopant gases of between 0.7 atomic percent and 10 atomic percent, typical dopant gases including $N_2$, or $PH_3$. Carbon deposition rates of between 2 and 12 Å per second can be provided by plasma beam source deposition methods within the above operating ranges, ideally being between about 8 and 9 Å per second to provide the highest quality films. Deposition times of between about 6 and 30 seconds are generally used at these rates to provide a sufficient protective coating for magnetic recording media. In work in connection with the present invention, M. Weiler et al. describes the preparation and properties of highly tetrahedral hydrogenated amorphous carbon deposited using a plasma beam source in the journal *Physical Review B*, vol. 53, pp. 1594–1608 (1996), the full disclosure of which is hereby incorporated by reference.

Although the plasma beam source deposition systems and methods described with reference to FIGS. 3A and 3D have several advantages, including the ability to accurately control the ion deposition energy and flux, these plasma beam sources do have some disadvantages. One primary disadvantage of plasma beam source deposition is that the capacitively coupled plasma density, and hence the deposition rate, is relatively low. In order to increase the ion density, it would be beneficial to provide higher pressures within the plasma confinement volume, preferably maintaining the plasma at a pressure of 30 mTorr or more. Unfortunately, the ionization coefficient tends to drop off at these higher pressures, thereby limiting the total plasma density. Specifically, it will generally be advantageous to maintain low deposition pressures for at least two reasons. First, the proportion of ions in the particle stream decreases with increasing pressures. Basically, at higher operating pressures, gas scattering will reduce and disperse the ion energy. In fact, deposition of highly tetrahedral amorphous carbon at pressures of over 30 mTorr when using the exemplary system is problematic, as films deposited at such pressures are formed primarily with low energy radicals. Second, as pressures increase, the particle flux increasingly includes varying particle masses ($C_2$, $C_4$, $C_6$, $C_8$ . . . ). As uniform mass particles are preferred, plasma beam deposition will preferably take place with pressures below 1 mTorr, ideally at a pressure of between about 0.1 and 0.5 MTorr. This in turn, generally limits the deposition rates which may be achieved by plasma beam sources and methods which rely solely on capacitative coupling to maintain the plasma.

Figure 4A:
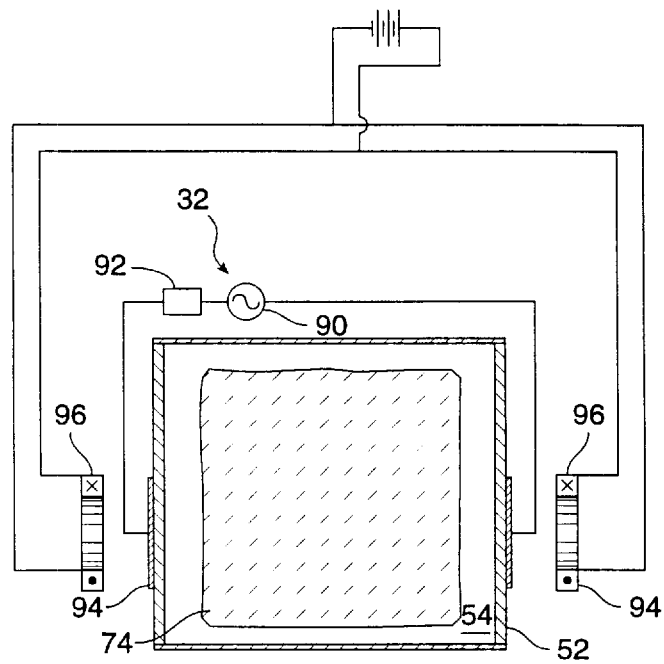
FIGS. 4A and B illustrate known resonant inductive ionization of a plasma with a fixed magnetic field.
Figure 4B:
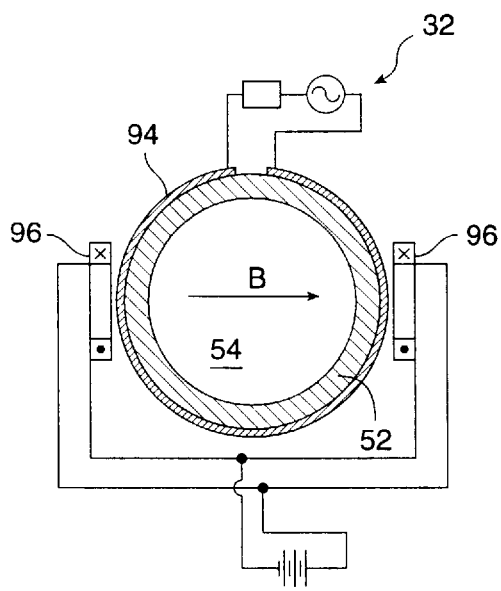
FIGS. 4C and D explain densification of the plasma provided by Electron Cyclotron Wave Resonance.

The hybrid beam source of the present invention maintains the advantageous ion energy control of the plasma beam source, but provides higher plasma densities and enhanced deposition rates without relying on increases in pressure. Referring once again to FIGS. 2 and 2A, hybrid source 30 combines an inductive ionization system 32 with a capacitive coupling system 36 (similar to that used in the plasma beam sources described above) to provide a high density and low pressure plasma. The inductive ionization system will again be explained in isolation, here with referenced to FIGS. 4A and B.

Inductive ionization system 32 comprises an alternating power source 90 capable of generating frequencies in roughly the radiofrequency-microwave range, preferably providing a potential with a frequency of about 27.12 MHz (or some multiple thereof). Once again, a frequency matching network 92 is provided, but the power is here coupled to the plasma using antenna 94 disposed around the plasma container 52. Advantageously, this minimizes any self-biasing of the plasma relative to the antenna, and minimizes deposition of source materials onto the walls of the container itself.

Plasma within an inductive discharge may be energized in a non-resonant or resonant inductive mode. Preferably, a small DC magnetic field is superimposed on the plasma volume to provide enhanced ion energy transfer and plasma densification through a process which is generally described as resonant ionization.

Antenna 94 may be described as a dielectric wall around the axis of the plasma container. Alternatively, antenna 94 may be modeled as a single loop inductive coil disposed about the plasma. Regardless, the potential of the plasma with respect to the container surface remains low, while the plasma density is quite high.

Typically, antenna 94 surrounds a cylindrical plasma container having a length between one third and three times its diameter, preferably being of nearly equal length and diameter. The antenna consists of a metal cylinder with a longitudinal slit. The superimposed static magnetic field B is generally normal to the axis of the plasma cylinder, and is applied by at least one magnetic coil 96 adjacent the plasma container. Resonant ionization potentials and magnetic field strengths are more fully described by Professor Oechsner in *Plasma Physics*, vol. 15, pp. 835–844 (1974), the full disclosure of which is incorporated herein by reference.

The mechanism which will provide plasma densification will apparently be Electron Cyclotron Wave Resonance (ECWR), rather than the related but different phenomenon of Electron Cyclotron Resonance (ECR). Both of these mechanisms can be understood with reference to the dispersion of an electromagnetic wave propagating parallel to a magnetic field, and more specifically, by analyzing the refraction index and the propagating velocity (here being phase velocity Vp) as a function of frequency and magnetic field strength. We know that the refraction index and propation velocity are related as follows:

$$\frac{\omega^2}{c^2 k^2} = \frac{v_p^2}{c^2} = \frac{1}{n^2}$$

where n is the refractive index, c is the speed of light, $\omega$ is the frequency of the electromagnetic wave, and k is the magnitude of the propagation vector for the electromagnetic wave. An ordinary wave can be explained as a superposition of right- and left-handed circularly polarized electromagnetic waves. In the case of a plasma, we should also consider the different charges and masses of the electrons and ions. From the right- and left-hand polarized wave equations, we find a resonance effect is provided when $\omega$ is equal to the cyclotron frequency $\omega_c$. Under these conditions, the refraction index goes to infinity, so that the propagation velocity is zero. This condition is referred to as ECR. Unfortunately, the wavelengths associated with ECR are generally larger than the desired sizes of our plasma containers, so that practical application of ECR for plasma densification would be difficult.

Fortunately, ECWR provides an alternative densification mechanism when $\omega$ is less than $\omega_c$. Neglecting the motion of ions due to their much higher mass, the dispersion relation for the right-hand polarized wave is approximated by:

$$n_R^2 = \frac{c^2 k^2}{\omega^2} = 1 - \frac{\omega_p^2/\omega^2}{1 - (\omega_c/\omega)}$$

Figure 4C:
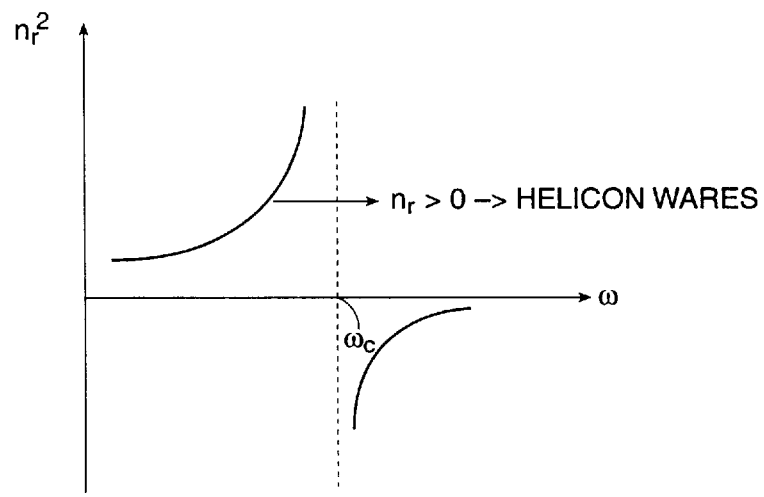
Figure 4D:
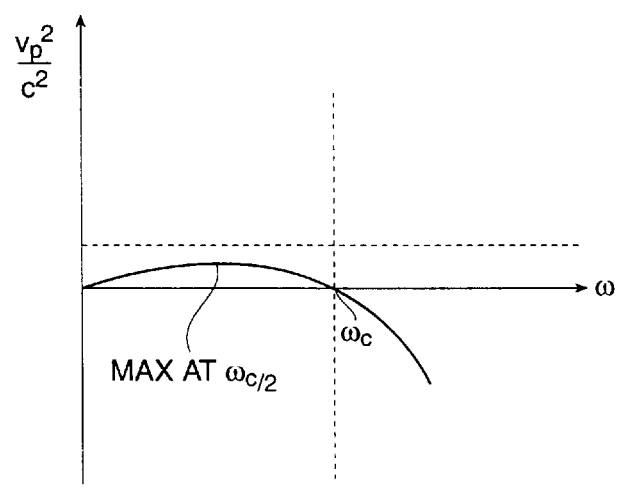

$\omega_p$ is the plasma frequency. Generally, wave propagation is possible when the phase velocity (and therefore the refractive index) is positive. Schematic plots of the refractive index of a cold plasma and the phase velocity of a cold plasma (both as a function of frequency) are given in FIGS. 4C and 4D. Examination of these plots reveals that both are positive below $\omega_c$. In fact, the refractive index for a driving potential having a frequency of 13.56 MHz will reach values above 100. This means that wavelengths within the plasma may be reduced by 1/100 or more. If the wavelength can be reduced to the dimensions of the plasma container, it is possible to create standing waves in the plasma which provide a resonant effect. This ECWR will depend on the magnetic filed strength as well as the plasma container dimensions. If our plasma container has a diameter a, this resonant effect can generally be achieved if:

$$k_r = \frac{2\pi}{\lambda} = \frac{\pi}{a}(2\mu + 1)$$

$\mu$=1, 2, 3, ..., $\lambda$ is the wavelength, and $k_r$ being the resonant magnetic field. The resonance can be tuned by varying the refractive index of the plasma. For ECWR, we will want to take into account that the refractive index for the right-hand polarized wave will depend on both the magnetic field and the plasma frequency. The variation of $n_r$ with the plasma frequency complicates this tuning somewhat, because the plasma frequency itself depends on the plasma density, which will, in turn, change with the degree of excitation of the plasma.

It is possibly to combine the densifying effects of inductive ionization on low pressure plasmas with the capacitive coupling ion beam extraction of the plasma beam source to greatly enhance deposition rates. Unfortunately, inductive ionization does not generally produce a uniform plasma density. Hence, such a hybrid deposition system, without further modification, produces a non-uniform ion stream and deposition process. For these reasons, the present invention further provides a quasi-static resonant ionization magnetic field, as will be explained with reference to FIGS. 2 and 2A.

Referring once again to FIG. 2A, hybrid source 30 makes use of a plasma which is capacitively coupled so as to provide a stream of plasma ions through extraction grid 64. To promote effective capacitive coupling, the plasma is maintained at a relatively low pressure, preferably below 1 mTorr. To enhance the density of the plasma, an inductive power transfer is locally achieved using antenna 94 of inductive coupling system 32. The DC plasma potentially from capacitive coupling, and hence the ion acceleration energy, is typically about 20 to 40 volts at all surfaces. Advantageously, ion energy can be selectively controlled by varying the DC bias of the extraction grid, as described above. A similar combination of inductive and capacitative coupling was described for sputter treatment of dielectric samples by Dieter Martin in a 1995 dissertation for Universität Kaiserslavtern, Fachbereich Physik, Germany. That reference more fully explains the independent variation of ion energy and ion current density, similar to that applied in the hybrid deposition system of the present invention.

Ion/radical fluxes from hybrid source 30 may be enhanced using the inductive coupling system 32. To homogenize the ion stream produced by hybrid source 30, a slow moving resonant ionization magnetic field is applied by quasi-static magnetic field generation system 34.

The preferred quasi-static magnetic field generation system makes use of a plurality of coils 96 disposed radially about the plasma containment volume. Field rotator 100 selectively energizes coils 96 in opposed pairs, to apply a fairly uniform magnetic field throughout the plasma. The opposed coils are energized in the same direction, but only briefly, after which an alternate pair of transverse magnetic coils are energized to apply a magnetic field $B_2$. Thereafter, the original coils may be reenergized, but with the opposite polarity so that magnetic field $B_3$, and then field $B_4$ are produced.

Field rotator 100 produces a magnetic field which effectively rotates through the plasma containment volume with a rotational frequency which is much less than the driving frequency of inductive coupling system 32, generally being less than 10,000 Hz, and often being less than 100 Hz. Thus, the rotating magnetic field provides resonant enhancement of the inductive coupling of a truly static resonant field. However, the rotation of the magnetic field densifies a much broader region of the plasma, and thereby provides a much more homogeneous ion stream. Moreover, the moving magnetic field may also further density the plasma by a churning effect, increasing the collisions between the energetic plasma particles to provide still further increases in deposition rate and energy transfer efficiency.

A typical hybrid source will have a container volume with an internal radius of about 5 cm, and a length between the coupling electrode and the extraction grid of about 8½ cm. Such a hybrid source will require an ionizing energy of between about 100 and 1000 watts, when driven at a frequency of about 13.56 MHz (or some multiple thereof). Clearly, a wide variety of alternative container geometries and sizes may be provided, within the scope of the present invention.

When using hybrid source 30 for deposition or etching, the plasma container and deposition vessel surrounding the substrate are evacuated, preferably at a relatively high speed of about 2,000 liters per second. The ambient pressure during deposition will preferably be kept at about $5 \times 10^{-4}$ mbar. Once again, a short burst of $N_2$ gas is superimposed on a steady flow of the source gas to facilitate striking of the plasma, and a gas comprising nitrogen may be continuously supplied where nitrogenation is desired. A burst on the order of a few milliseconds will suffice, or, alternatively, a high voltage pulse striker circuit may be used with similar results. Ion current densities are substantially higher than the 0.1 to 0.7 mA/cm$^2$ provided by plasma beam sources, and may provide carbon deposition rates of between about 20 to 100 Å per second.

Although hybrid source 30 is a preferred embodiment, a wide variety of alternative systems may also be used. For example, the moving magnetic field may be provided by mechanically rotating one or more coils about the plasma containment volume.

Figure 5:
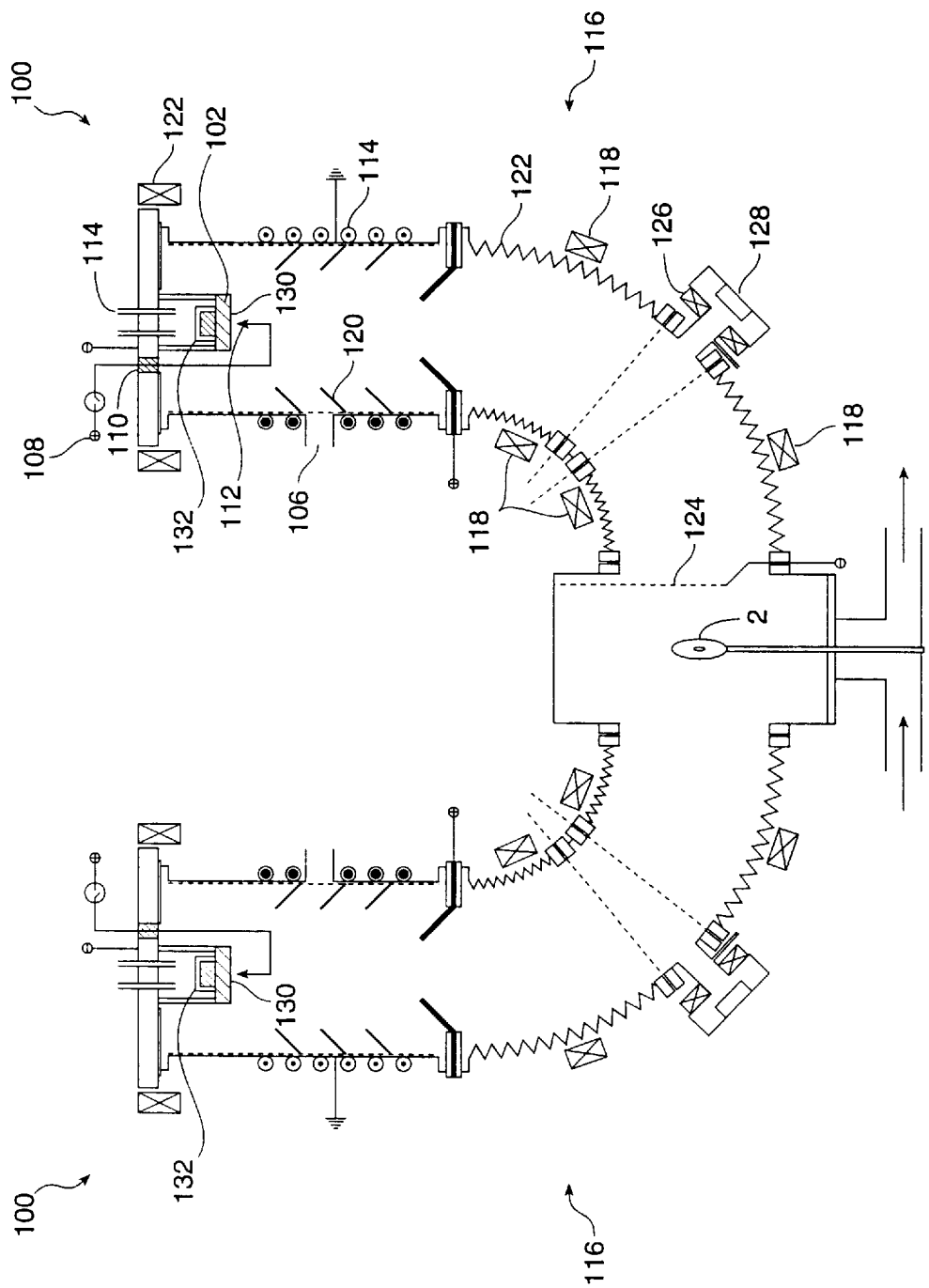
FIG. 5 illustrates an alternative method and deposition system for producing the recording disk of FIG. 1, which system relies upon a filtered cathodic arc for deposition of the highly tetrahedral amorphous hydrogenated carbon material of the present invention.

A still further alternative deposition system will be described with reference to FIG. 5. As illustrated, magnetic disk 2 is simultaneously coated on both sides by a pair of filtered cathodic arc sources 100. Each cathodic arc source includes a high density carbon target 102 which is used as a cathode. Here, a plasma is maintained by an electrical potential of the cathode relative to a graphite extractor anode 104 once the chamber has been evacuated through evacuation port 106.

Generally, cathodic arc deposition relies on a low voltage discharge at pressures of less than $10^{-5}$ mbar. Vaporized electrode material in the form of highly ionized intraelectrode plasma provides current transport between the cathode and anode. Typically, the solid cathode is consumed through microscopic localized regions of very high current density and temperature, the cathode typically being an electrically conductive deposition material such as a metal, carbon, or highly doped semiconductor. Advantageously, the kinetic energy of ions can be electrostatically varied by biasing the substrate relative to the cathode. Energetic bombardment of the film using cathodic arc source 100 can produce dense and continuous films through subplantation, as described above. High deposition rates of between 30 and 100 Å per second, together with high throwing power (the ability to coat uniformly in three dimensions) are also provided by the intense ion flux.

To initiate the arc, piezo system 108 passes through the wall of the deposition chamber using a linear and rotary feedthrough 110 so as to initially energize a graphite striker 112. Water cooling 114 helps confine the discharged energy to the deposition system.

Unfortunately, cathodic arc systems suffer from the expulsion of macroparticles (together with the plasma) from the surface of the cathode. The inclusion of these macroparticles can seriously limit the quality of films grown on substrates placed in front of the cathode. Therefore, source 100 blocks the direct path between the cathode and the magnetic recording media or other substrate to be coded using a curvilinear duct 116. Magnetic field coils 118 direct the desired particles through curvilinear duct 116, effectively filtering out the majority of the macroparticles. The use of baffles 120, and an irregular duct surface formed by bellows 122, helps to prevent the macroparticles from bouncing along the curvilinear duct, thereby providing a more effective filter. The duct will typically be about 7.3 inches in diameter, while the curve may have a centerline radius of about ten inches.

The filtered ion stream may be optionally accelerated towards the substrate using an acceleration grid 124. Alternatively, the substrate itself may be biased. To provide a more uniform deposition process, the filtered ion stream may also be scanned over the substrate surface using a raster magnetic field supplied by raster coils 126. Optionally, the ion stream may be monitored through viewport 128. Steering magnetic fields may also be provided at the cathode by steering coils 129.

It would be advantageous to minimize the macroparticles ejected from the cathode, rather than relying entirely on filtering. Toward that end, the present invention provides cathodes which are adapted to distribute an arc over a diffuse cathodic surface area, rather than forming a number of discrete arc spots or jets. To provide such a distributed cathodic arc over an active region 130 of cathodic source 102, the power per unit area is generally raised to a sufficient level for the active region to reach a critical temperature.

Cathodic arc deposition of graphite is particularly problematic, as graphite in general is difficult to evaporate or sublime by electrical heating, largely because of its anomalous negative temperature coefficient of electrical resistivity (up to about 1,200° K). Graphite is generally porous in nature, leading to large quantities of macroparticles being ejected during arcing. While the curvilinear duct filter described above has proven effective at limiting the amount of macroparticles reaching the substrate, this structure also produces a magnetic pinching of the plasma stream, which reduces the area of deposition and tends to produce inhomogeneity in the thickness of the deposited films. Additionally, over a long period of time, the contamination of the filter duct walls can be disadvantageous, as charged carbon dust from the wall may become entrapped in the plasma stream and contaminate the film.

To reduce macroparticle content from a graphite target, the temperature of the cathode at or near the surface is increased to a temperature above the minimum point in the resistivity versus temperature curve for various types of graphite. Ideally, the temperature will be raised substantially beyond this minimum resistivity temperature to enhance ohmic heating and thus evaporate the graphite more effectively. To provide a more stable process, it is generally advantageous to make use of a direct current cathodic arc, in which the arc itself can have a overall lifetime of minutes, unlike spot or transient arcs which can appear and dissipate across the surface of the cathode within a time span on the order of a few nanoseconds. The goal here is to enhance the effect of local heat accumulation at the surface of the cathode, and to promote this heat trapping process on a time scale which is significantly longer than that of known arc deposition systems. Work in connection with the present invention has shown that continuous DC arcs may be produced with durations of over 1 minute and preferably of over 3 minutes.

Energy conservation at the cathode implies that the energy input and energy output are equal. Energy is generally supplied to the cathode surface through ohmic heating, ion bombardment, and Nottingham heating. Energy will be lost during the process through electron emission cooling, evaporation cooling, and heat transfer by conduction, radiation, and convection.

The carbon cathode itself may optionally be prepared by compressing high purity graphite powder at a hydrostatic pressure of between about 130 and 150 MPa. The density of such a cathode will typically be between about 1.5 and 1.7 g/cm$^3$. To enhance the heat trapping at the cathode surface, the cathode can be thermally insulated with thermal insulation 132.

When the arc is first struck, the cathodic discharge evolves as a visible microscopic dot with a plasma ball, similar in appearance to known cathode vacuum arcs. At the initial stage of arc triggering, the arc voltage is about 20 volts, which is typical of spot arcs for the same arc current. Sometime after ignition, however, the single cathodic spot will evolve into a diffuse active area, preferably being at least 2 cm$^2$. Ideally, the surface temperature within that area reaches a value nearing the sublimation temperature of graphite, often being over 2,000° C. The steady state distributed arc mode may be characterized by a mean arc voltage value that fluctuates over about 25 volts, ideally being between about 30 and 33 volts. The imposition of a steering magnetic field may decrease the transition time from the spot mode to the distributed arc mode.

A reduction in macroparticle content may be visible observed as a reduction of the number of incandescent particles within the plasma as compared to the standard spot arc. A diffuse plasma cloud is formed over the cathode surface, and the wide amplitude fluctuations characteristic of the spot arc are reduced. Additionally, the audible rattling noise often provided by filter cathodic arcs is replaced by a notably quieter erosion process. Erosions of 2 mg/s have been measured over a series of runs accumulating a total of 5 minutes of arcing.

Rise in the cathodic temperature may conveniently be produced by the reverse ion bombardment and Joule heating of cathode 102. Thermal insulation 132 may also prevent dissipation of the heat energy to cooling water system 114. Thermal insulation may be disposed over a selected portion of cathode 102 so as to selectively control the size and position of active region 130.

The distributed cathodic arc of the present invention produces a significantly lower total current density and a higher spatial uniformity in ion current density. Such a distributed arc may make use of a higher arc voltage than in the more conventional cold cathodic arc sources, as well as a reduced amplitude in arc current oscillations, which will help to decrease the macroparticle content of the associated plasma. Reduction of macroparticles will reduce cleaning and maintenance of a filter duct, and may even allow unfiltered deposition. Unfiltered carbon distributed arc films may be produced having densities of over 3 g/cm$^3$ with a mean ion energy of 18 eV, at over 50 Å/s, by a particle flux with an ionization of over about 60%.

EXPERIMENTAL

Films were deposited on aluminum substrates over a magnetic layer using opposed plasma beam sources and acetylene plasmas. The deposition conditions are summarized in Table 1. These conditions gave a highly ionized plasma and an ion beam energy of about 120 eV/C ion within a well-defined energy window.

TABLE I

| Item | A-side | B-side | Condition |
|---|---|---|---|
| rf-input power | 250 W | 250 W | Phase-matched |
| rf-reflected power | 5 ± 1 W | 7 ± 1 W | Stable during deposition |
| Inner Coil Current | 7.0 Å | 7.0 Å | |
| Outer Coil Current | −0.5 Å | −0.5 Å | Reverse Polarity |
| Gas-flow rate | 18 sccm | 18 sccm | Plasma ignited at 43 sccm with a burst of N$_2$ gas |
| Dep-Rate | 8–9 Å/s | 8–9 Å/s | Deposition time varied from 10–30 s |

The acetylene gas flow rate was pre-set (by an electronic controller) to promote diamond-like bonding in the ta—C:H carbon films, rather than optimizing the deposition rate. Gas flow rates are in standard cubic centimeters per second (sccm). The matching-network circuit passive elements were pre-tuned so as to minimize the ratio of $P_{ref}/P_{in}$ (power reflected over power input) at the above-mentioned acetylene flow rate.

The rate phase state was triggered using a short burst of N$_2$ gas (lasting less than 0.1 s) superimposed on the steady flow of C$_2$H$_2$. The pressure of the chamber during deposition was in the region of 5*10$^{-4}$ mbar. Textured and untextured smooth disks were coated, and the carbon coatings were characterized using ellipsometry, electron energy loss spectroscopy (EELS) and Raman finger-printing. The textured disks were lubed using conventional lube processes, and underwent abrasive tape tests as well as accelerated start-stop tests.

Table II summarizes the variation of physical properties of the films as a function of thickness. The average ion energy per carbon ion was uniformly maintained at about 100 eV. The spatial homogeneity of the films is gauged in both the radial as well as angular positions. Generally, G-peak and D-peak are V-peak positions in Raman spectroscopy, while the associated A values describe peak widths. Selket voltage is the output voltage of a light sensor for abrasive wear test equipment manufactured by Selket Co. The higher the output voltage, the more serious the wear.

TABLE II

| Item | thickness (Å) ± 10 | Selket Voltage (mV) | G-peak ± 5 cm$^{-1}$ | G-peak Δ ±5 cm$^{-1}$ | RMS* $R_a$ (Angs) | Raman $I_d/I_g$ | Plasmon Peak (eV) |
|---|---|---|---|---|---|---|---|
| Cell 1 | 40  | 3 | 1494 | 150 | 3 | 0.24 | 31.4 |
| Cell 2 | 50  | 2 | 1498 | 152 | 4 | 0.48 | 30.0 |
| Cell 3 | 70  | 5 | 1508 | 138 | 6 | 0.5  | 29.5 |
| Cell 4 | 80  | 7 | 1507 | 137 | 6 | 0.6  | 29.8 |
| Cell 5 | 100 | 6 | 1509 | 130 | 9 | 0.7  | 29.7 |
| Cell 6 | 200 | 7 | 1509 | 130 | 8 | 1.0  | 25.5 |

One noteworthy observation from the Raman spectra is the increase in both the position of the G-peak as well as the $I_d/I_g$ ratio (the area ratio of the D and G peaks) with increasing film thickness. This shows that the percentage of C—C sp$^3$ content in the bulk of the films increases with decreasing thickness. D-peak bandwidth also increases with decreasing film thickness within the range monitored. The bandwidth of the D-peak in the optimized films is above 150 cm$^{-1}$, indicating very low levels (or absence) of graphitic phase clustering within the diamond-like carbon amorphous matrix. This result is consistent with the relatively high Plasmon-peak measured from the electron-energy-loss-spectroscopy (EELS). Plasmon peak is the energy of a type of excitation called a plasmon. It is a quantum of charged particle cloud vibration. The energy value is directly related to the charged particle (e.g., electron) density.

The Plasmon-peak $E_p$ is representative of the density of the films. Thus, taking the $E_p$ of diamond to be 34 eV, it is estimated that the most-diamond-like ta—C:H films have above 80% C—C sp$^3$ bonding (this is independent of whether there is long range order or not).

Disks were coated with ta—C:H films under a wide variety of rf-power and gas-feedstock flow rates. These films were then tested for friction build-up and wear durability using a conventional accelerated contact start/stop (CSS) test. Prior to testing, the disks were lubed and lube thickness was found to vary between 16–23 Å, corresponding to a carbon film thickness range of 30 Å to 150 Å. Each test consisted of 500 cycles, and the disks were tested on both sides at 300 rpm. The averaged coefficients of friction ($\mu_s$) are plotted against thickness of the films in Table III. The variation of $\mu_s$ is found to be between 0.5 to 1.5, corresponding to a thickness range from 40 Å to 150 Å. Of the 16 disks that underwent the accelerated CSS test, all but one passed.

TABLE III

| rf power (Watts) | Gas flow-rate (sccm) | Deposition time(s) | Coefficient of static friction $\mu_s$ |
|---|---|---|---|
| 500 | 20 | 10 | 1.6 |
| 100 | 12 | 30 | 1.8 |
| 500 | 20 | 6  | 1.5 |
| 100 | 20 | 6  | 1.6 |
| 300 | 16 | 6  | 1.4 |
| 500 | 20 | 6  | 1.5 |
| 500 | 20 | 30 | 2.0 |
| 500 | 20 | 12 | 1.5 |
| 500 | 20 | 6  | 1.9 |
| 100 | 12 | 6  | 1.7 |
| 100 | 12 | 6  | 1.6 |
| 100 | 12 | 30 | 1.6 |
| 100 | 16 | 18 | 1.5 |
| 300 | 16 | 6  | 1.3 |

Disks were also coated with highly tetrahedral amorphous carbon using a filtered cathodic arc. Initially, two disks were coated with a static ion stream, producing coatings which varied considerably from the center to the edge. Estimating coating thicknesses using interference colors, and assuming an index of refraction of 2.5, coating thicknesses varied at least between 1,250 Å and 500 Å.

Figure 6A:
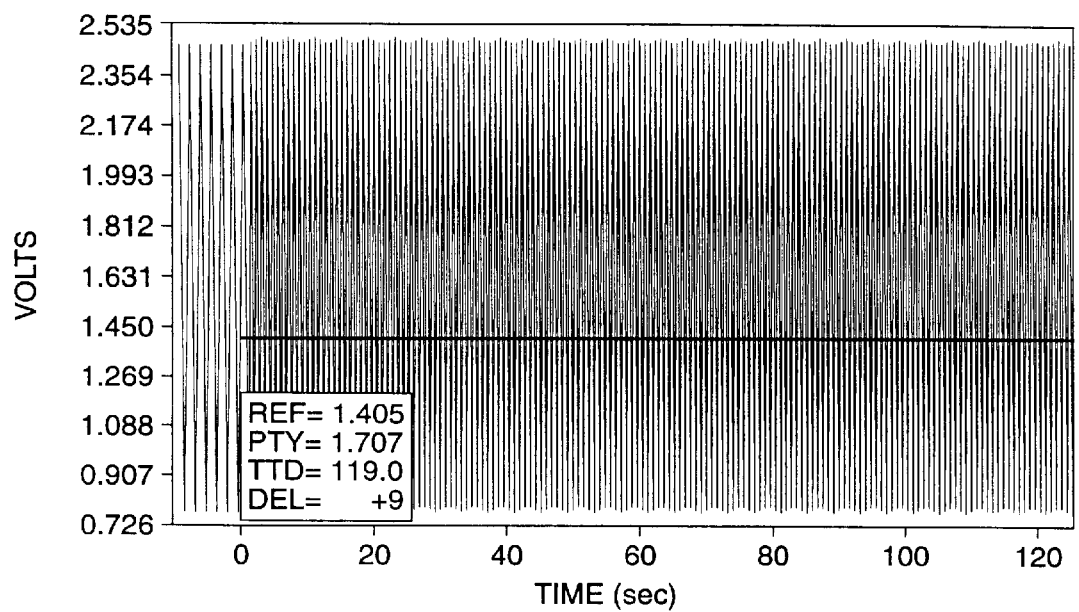
FIGS. 6A, 6B, 7 and 8 show experimental data, as described in detail in the experimental section.
Figure 6B:
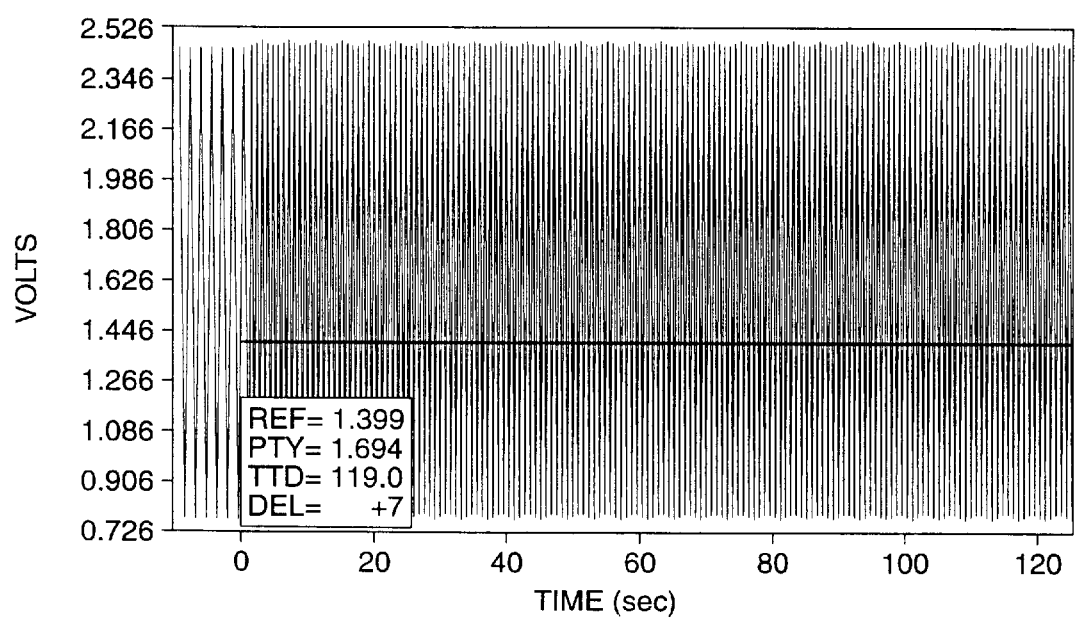

Raw data from Selket abrader tests are provided in FIGS. 6A and B. Over the two 120 second tests, no debris was seen on the tape. Only a very faint wear track was found after tests were complete.

Figure 7:
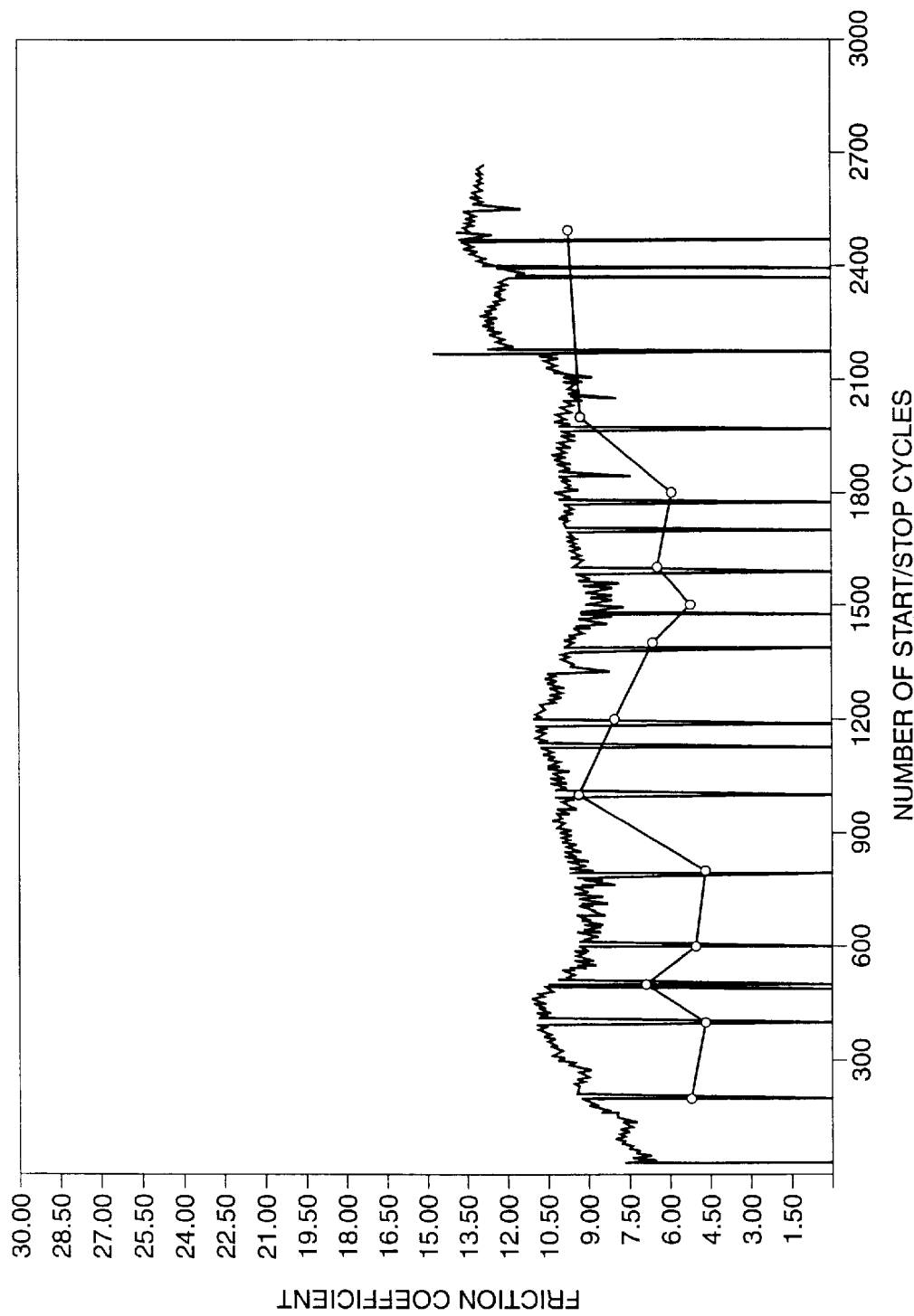

Peak friction of the disks was also measured as a function of the number of start/stop cycles. The results of these tests are provided in FIG. 7.

Figure 8:
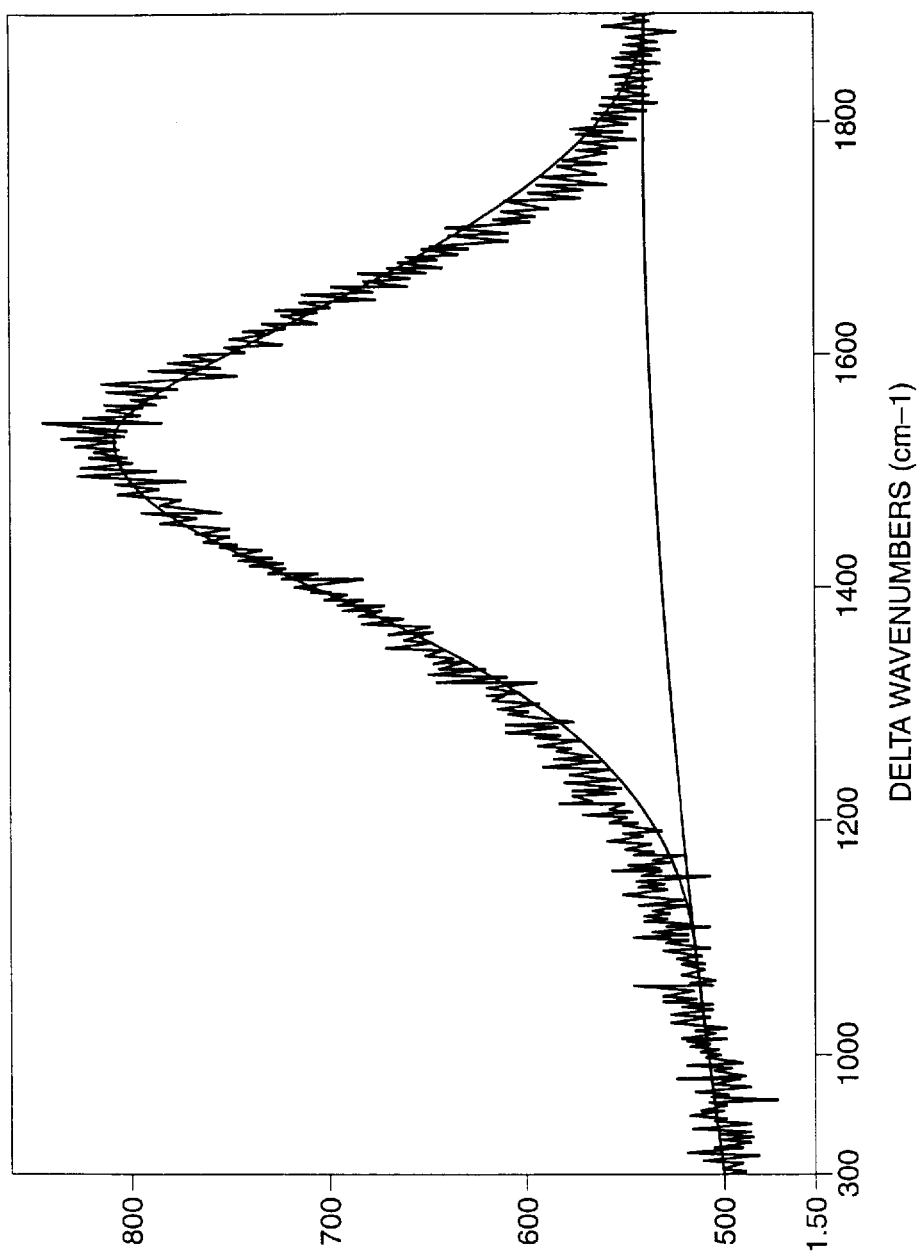

The Raman spectra of the filtered cathodic arc disks were also measured, and the results are provided in FIG. 8. Generally, these results indicate that a film can be deposited using a cathodic arc source which includes a G-peak in the area of about 1518, and having a G width of approximately 175. The pseudo band gap of this film appears to be roughly 1.68 eV, while the refractive index is approximately 2.5. The complex portion of the optical index of refraction, K, appears to be approximately 0.08 for the film.

An additional disk was coated, this time on both sides, using a filtered cathodic arc source. The ion stream was swept over the surface of the substrate by manipulating permanent magnets placed on either side of the chamber. No bias was applied to the scanned substrate. Although the scanning mechanism here was quite simple, a more uniform deposition layer was provided.

Although the foregoing invention has been described in some detail, by way of illustration and example, for purposes of clarity of understanding, it will be obvious that certain changes and modifications may be practiced within the scope of the appended claims.

What is claimed is:

1. A method for producing magnetic recording media, the method comprising:

forming a magnetic layer over a substrate;

supporting the substrate in a deposition chamber;

ionizing a source material in a plasma chamber so as to form a plasma containing ions which comprise carbon; and energizing the ions to form a stream from the plasma in the plasma chamber straight toward the substrate in the deposition chamber so that carbon from the ions is deposited over the magnetic layer, wherein the ions are energized using capacitative coupling by applying a capacitative alternating potential between a coupling electrode adjacent a first end of the plasma chamber and an extraction electrode adjacent a second end of the plasma chamber, the first and second ends defining an axis therebetween, the extraction electrode having a smaller surface area than the coupling electrode so that the plasma is self-biasing relative to the extraction electrode, wherein the ions impact with an energy which promotes formation of $sp^3$ carbon—carbon bonds, and wherein the impacting ions have a substantially uniform weight.

2. A method as claimed in claim 1, further comprising selectively energizing the stream with a predetermined impact energy.

3. A method as claimed in claim 1, wherein the stream impacting the substrate is primarily composed of ions having a uniform weight.

4. A method as claimed in claim 1, wherein the impact energy of the ions is substantially uniform.

5. A method as claimed in claim 1, wherein the impact energy is between about 57 and 130 eV for each carbon atom.

6. A method as claimed in claim 15, wherein the impact energy is between about 100 and 120 eV for each carbon atom.

7. A method as claimed in claim 1, wherein the extraction electrode is disposed between the plasma and the deposition chamber, the stream passing axially through the extraction electrode.

8. A method as claimed in claim 7, wherein the energizing step is performed using inductive coupling by applying an inductive alternating potential to an antenna disposed circumferentially around the plasma chamber.

9. A method as claimed in claim 8, further comprising densifying the plasma by applying a magnetic field within the plasma chamber.

10. A method as claimed in claim 9, further comprising homogenizing the plasma by moving the magnetic field within the plasma chamber.

11. A method as claimed in claim 10, wherein the magnetic field is rotated about the axis within the plasma chamber by selectively energizing coils arranged radially about the plasma chamber.

12. A method as claimed in claim 11, wherein the magnetic field rotates with a frequency which is much less than a frequency of the capacitative potential and much less than a frequency of the inductive potential.

13. A method for producing magnetic recording media, the method comprising:
   forming a magnetic layer over a substrate;
   ionizing a source material by interelectrode vaporization of the source material, the source material comprising a solid carbon cathode, wherein the carbon cathode is heated sufficiently to produce an arc that is distributed over the cathode so as to inhibit ejection of macroparticles while forming a plasma containing ions which comprise carbon; and
   energizing the ions to form a stream from the cathode straight toward the substrate so that carbon from the ions is deposited over the magnetic layer, wherein the ions impact with an energy which promotes formation of $sp^3$ carbon—carbon bonds.

14. A method as claimed in claim 13, wherein the energizing step comprises electrostatically biasing the ions toward the substrate.

15. A method as claimed in claim 13, wherein the energizing step comprises selectively accelerating the ions toward the substrate to provide the impact energy.

16. A method as claimed in claim 15, wherein the selectively energizing step comprises varying the potential of a cathodic arc source.

17. A method for producing magnetic recording media, the method comprising:
   forming a magnetic layer over a substrate;
   ionizing a source material so as to form a plasma containing ions which comprise carbon; and
   energizing the ions to form a quasi-neutral stream from the plasma toward the substrate by applying an alternating potential between a coupling electrode and an extraction grid having a smaller surface area than the coupling electrode so that the plasma is self-biasing relative to the extraction grid, wherein the ions are energized so that carbon from the ions is deposited over the magnetic layer, and wherein the ions impact with an energy which promotes formation of $sp^3$ carbon—carbon bonds.

18. A method for producing magnetic recording media, the method comprising:
   forming a magnetic layer over a substrate;
   ionizing a source material so as to form a plasma containing ions which comprise carbon, wherein the source material comprises a gas having a substantially coherent dissociation energy spectra; and
   energizing the ions to form a stream from the plasma toward the substrate so that carbon from the ions is deposited over the magnetic layer, wherein the ions impact with an energy which promotes formation of $sp^3$ carbon—carbon bonds.

19. A method as claimed in claim 18, wherein the source material comprises acetylene.

20. A method for producing magnetic recording media, the method comprising:
   supporting a substrate in a deposition chamber;
   inductively ionizing a source material in a plasma chamber with an antenna disposed circumferentially about the plasma chamber so as to maintain a plasma in the plasma chamber, the plasma containing ions which comprise carbon;
   capacitively energizing the ions by applying an alternating potential between a coupling electrode adjacent one end of the plasma chamber and an extraction electrode adjacent another end of the plasma chamber so as to form a stream of ions through the extraction electrode, the stream passing from the plasma chamber to the substrate in the deposition chamber, wherein the ions impact with an energy which promotes formation of $sp^3$ carbon—carbon bonds.

21. A method as claimed in claim 20, further comprising:
   densifying the plasma in the plasma chamber by directing a magnetic field into the plasma chamber.

22. A method as claimed in claim 21, further comprising rotating the magnetic field laterally through the plasma chamber.

23. A method as claimed in claim 20, wherein the source material comprises acetylene.

* * * * *